US012796155B2

(12) United States Patent
Wang et al.

(10) Patent No.: US 12,796,155 B2
(45) Date of Patent: Nov. 10, 2026

(54) LENSES AND METHODS OF MANUFACTURING THE SAME

(71) Applicant: Taiwan Semiconductor Manufacturing Company, Ltd., Hsinchu (TW)

(72) Inventors: Yi-Hsuan Wang, Hsinchu City (TW); Cheng Yu Huang, Hsinchu (TW); Chun-Hao Chuang, Hsinchu City (TW); Keng-Yu Chou, Kaohsiung City (TW); Wen-Hau Wu, New Taipei City (TW); Wei-Chieh Chiang, Yuanlin Township, Changhua County (TW); Chih-Kung Chang, Zhudong Township, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 405 days.

(21) Appl. No.: 18/472,594

(22) Filed: Sep. 22, 2023

(65) Prior Publication Data

US 2025/0107268 A1 Mar. 27, 2025

(51) Int. Cl.
*H10F 77/122* (2025.01)
*H10D 84/90* (2025.01)
(Continued)

(52) U.S. Cl.
CPC ....... *H10F 77/1228* (2025.01); *H10D 84/907* (2025.01); *H10D 86/0231* (2025.01);
(Continued)

(58) Field of Classification Search
CPC .... H10F 77/1228; H10F 77/14; H10F 77/337; H10F 77/70; H10F 39/024; H10F 39/184;
(Continued)

(56) References Cited

U.S. PATENT DOCUMENTS 12,153,233 B1 * 11/2024 Xin .......................... H10F 77/40
2021/0066356 A1 * 3/2021 Sugizaki .................. G02B 5/20
(Continued)

FOREIGN PATENT DOCUMENTS

TW 1535292 B 5/2016
TW 202333367 A 8/2023

OTHER PUBLICATIONS

Ming Lun Tseng, et al., "Vacuum ultraviolet nonlinear metalens," Science Advances, vol. 8 (2022), 8 pages.
(Continued)

*Primary Examiner* — John M Parker
*Assistant Examiner* — Vicente Rolando Gonzales
(74) *Attorney, Agent, or Firm* — Harrity & Harrity, LLP

(57) ABSTRACT

A plurality of holes in a top surface of a silicon medium form a plurality of sub-meta lenses to result in multiple focal points rather than a single point (resulting from using a single meta lens). As a result, optical paths for incoming light are reduced as compared with a single optical path associated with a single meta lens, which in turn reduces angular response of incident photons. Thus, a pixel sensor including the plurality of sub-meta lenses experiences improved light focus and greater signal-to-noise ratio. Additionally, dimensions of the pixel sensor are reduced (particularly a height of the pixel sensor), which allows for greater miniaturization of an image sensor that includes the pixel sensor.

20 Claims, 19 Drawing Sheets

(51) Int. Cl.

| | |
|---|---|
| ***H10D 86/01*** | (2026.01) |
| ***H10F 30/223*** | (2025.01) |
| ***H10F 77/14*** | (2025.01) |
| ***H10F 77/30*** | (2025.01) |
| ***H10F 77/70*** | (2025.01) |

(52) U.S. Cl.

CPC ......... *H10F 30/2235* (2025.01); *H10F 77/14* (2025.01); *H10F 77/337* (2025.01); *H10F 77/70* (2025.01); *H10D 84/929* (2025.01)

(58) Field of Classification Search

CPC ............. H10F 39/8063; H10F 39/8067; H10F 39/807; H10F 39/806; H10F 30/2235; H10D 84/907; H10D 84/929; H10D 86/0231

See application file for complete search history.

(56) References Cited

U.S. PATENT DOCUMENTS

| | | | | |
|---|---|---|---|---|
| 2021/0143201 | A1* | 5/2021 | Woehler | H10F 39/18 |
| 2022/0384508 | A1 | 12/2022 | Keum et al. | |
| 2023/0215887 | A1* | 7/2023 | Qian | H10F 39/184 257/432 |
| 2023/0282671 | A1 | 9/2023 | Zang et al. | |
| 2023/0290796 | A1* | 9/2023 | Varghese | H10F 39/811 |

OTHER PUBLICATIONS

Pending U.S. Appl. No. 18/319,064, entitled "Nanoscale Holes for Pixel Sensors and Methods of Forming the Same" (filed May 17, 2023).

* cited by examiner

LENSES AND METHODS OF MANUFACTURING THE SAME

BACKGROUND

Complementary metal oxide semiconductor (CMOS) image sensors utilize light-sensitive CMOS circuitry to convert light energy into electrical energy. The light-sensitive CMOS circuitry may include a photodiode formed in a silicon substrate. As the photodiode is exposed to light, an electrical charge is induced in the photodiode (referred to as a photocurrent). The photodiode may be coupled to a switching transistor, which is used to sample the charge of the photodiode. Colors may be determined by placing filters over the light-sensitive CMOS circuitry.

Light received by pixel sensors of a CMOS image sensor is often based on the three primary colors: red, green, and blue (R, G, B). Pixel sensors that sense light for each color can be defined through the use of a color filter that allows the light wavelength for a particular color to pass into a photodiode. Some pixel sensors may include a near infrared (NIR) pass filter, which blocks visible light and passes NIR light through to the photodiode.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
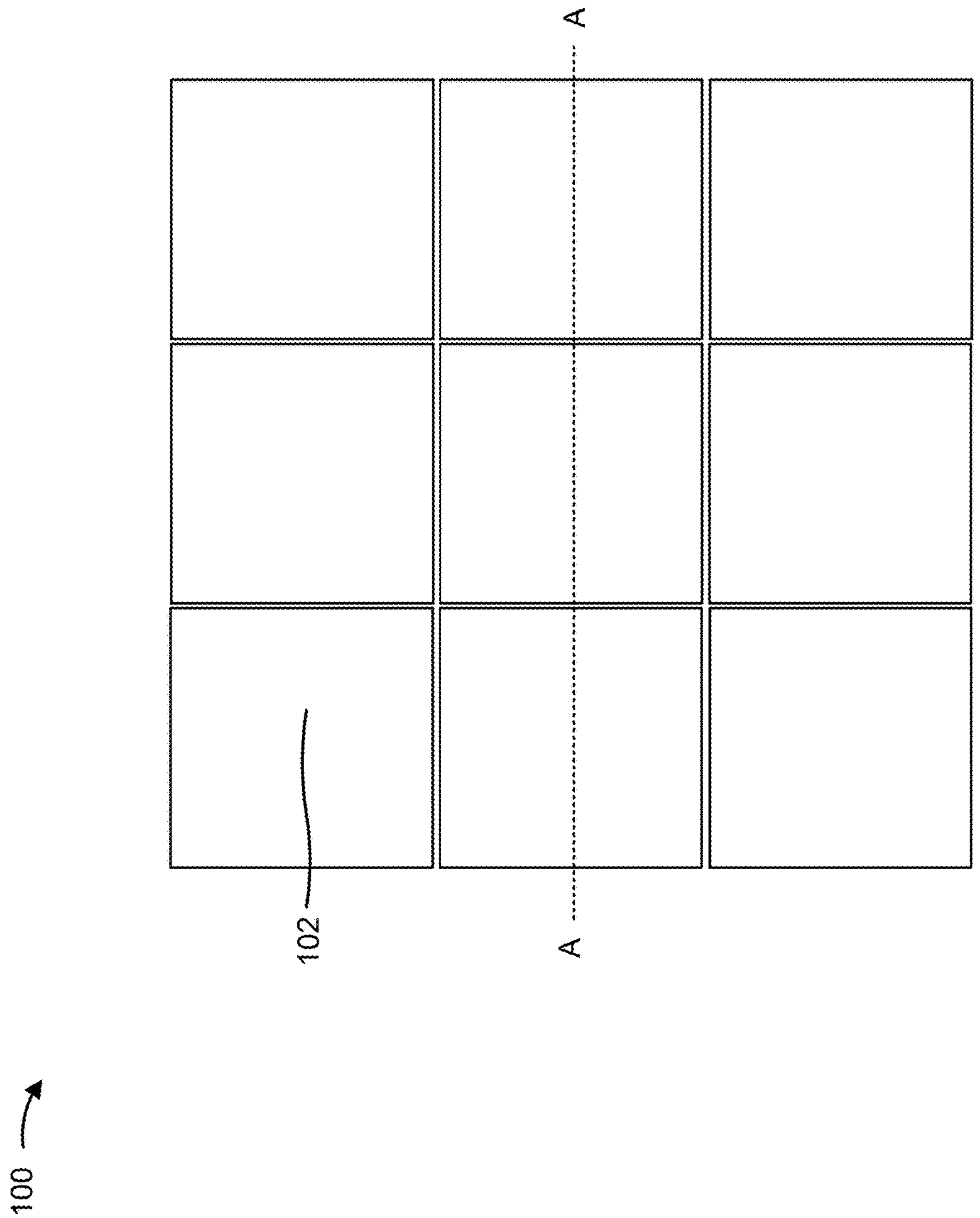
FIG. 1 is a diagram of an example pixel array described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases, pixel sensors convert photons to electrical signals. In order to focus the photons, a microlens may be used. However, microlenses are thick and therefore are not useful for miniaturized image sensors, such as near infrared (NIR) image sensors. A meta lens may replace a microlens in order to achieve thinner pixel sensors. For example, the meta lens may include holes in top surface of a silicon layer that are configured to focus incoming light. However, the light does not focus well when an optical path through silicon is long.

Some implementations described herein provide techniques and apparatuses for forming holes in a silicon medium that form a plurality of sub-meta lenses to result in multiple light focusing points (also referred to as "focal points") rather than a single point (resulting from using a single meta lens). As a result, optical paths for incoming light are reduced as compared with a single optical path associated with a single meta lens, which in turn reduces angular response of the photons. Thus, the pixel sensor experiences improved light focus and greater signal-to-noise ratio (SNR). Additionally, dimensions of the pixel sensor are reduced (particularly a height of the pixel sensor), which allows for greater miniaturization of an image sensor that includes the pixel sensor.

FIG. 1 is a diagram of an example pixel array 100 (or a portion thereof) described herein. The pixel array 100 may be included in an image sensor, such as a complementary metal oxide semiconductor (CMOS) image sensor, a back side illumination (BSI) CMOS image sensor, or another type of image sensor.

FIG. 1 shows a top-down view of the pixel array 100. As shown in FIG. 1, the pixel array 100 may include a plurality of pixel sensors 102. As further shown in FIG. 1, the pixel sensors 102 may be arranged in a grid. In some implementations, the pixel sensors 102 are square-shaped (as shown in the example in FIG. 2). In some implementations, the pixel sensors 102 include other shapes such as circle shapes, octagon shapes, diamond shapes, and/or other shapes.

The pixel sensors 102 may be configured to sense and/or accumulate incident light (e.g., light directed toward the pixel array 100). For example, a pixel sensor 102 may absorb and accumulate photons of the incident light in a photodiode. The accumulation of photons in the photodiode may generate a charge representing the intensity or brightness of the incident light (e.g., a greater amount of charge may correspond to a greater intensity or brightness, and a lower amount of charge may correspond to a lower intensity or brightness).

The pixel array 100 may be electrically connected to a back-end-of-line (BEOL) metallization stack (not shown) of the image sensor. The BEOL metallization stack may electrically connect the pixel array 100 to control circuitry that may be used to measure the accumulation of incident light in the pixel sensors 102 and convert the measurements to an electrical signal.

Figure 2A:
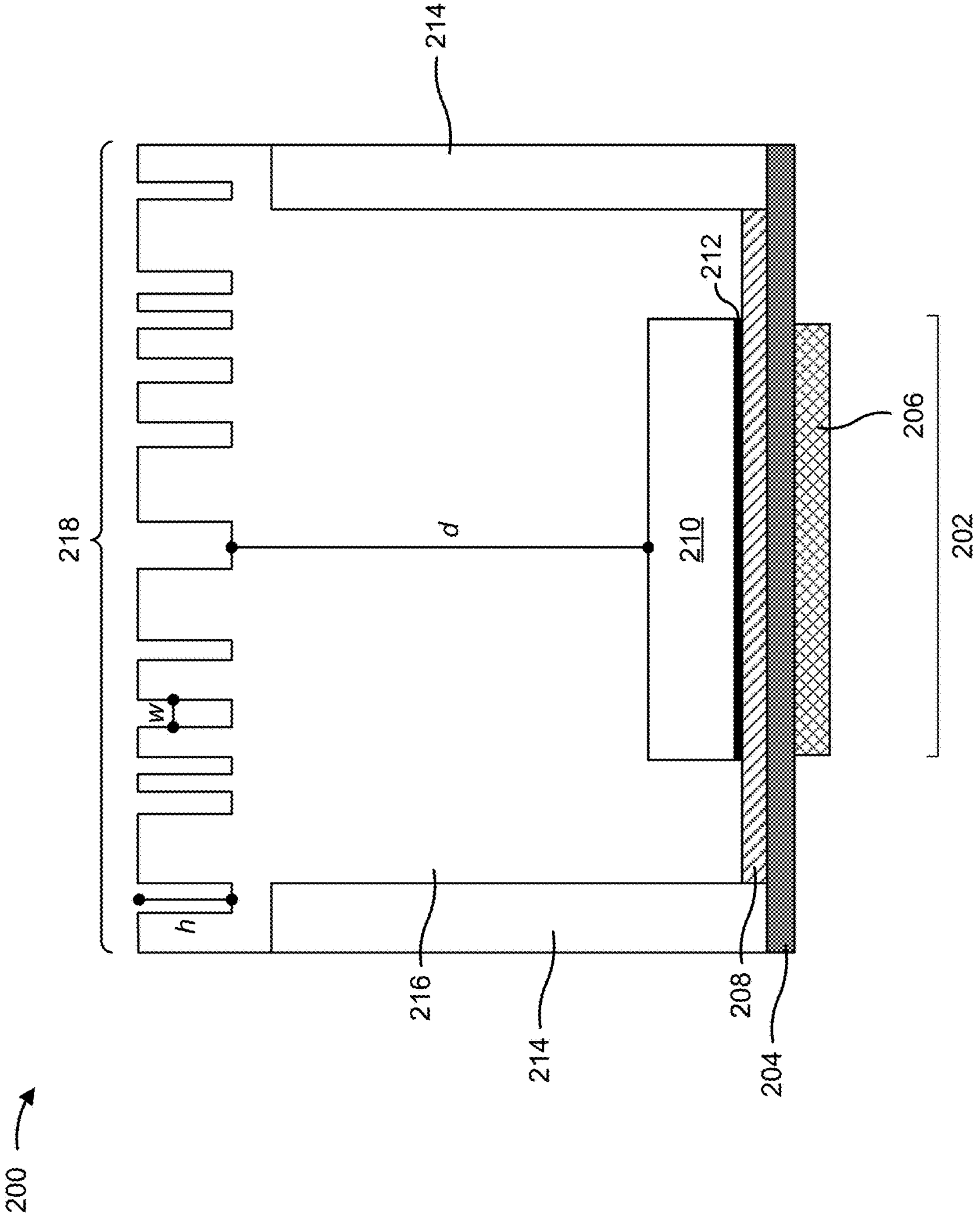
FIGS. 2A-2C are diagrams of example semiconductor structures described herein.
Figure 2B:
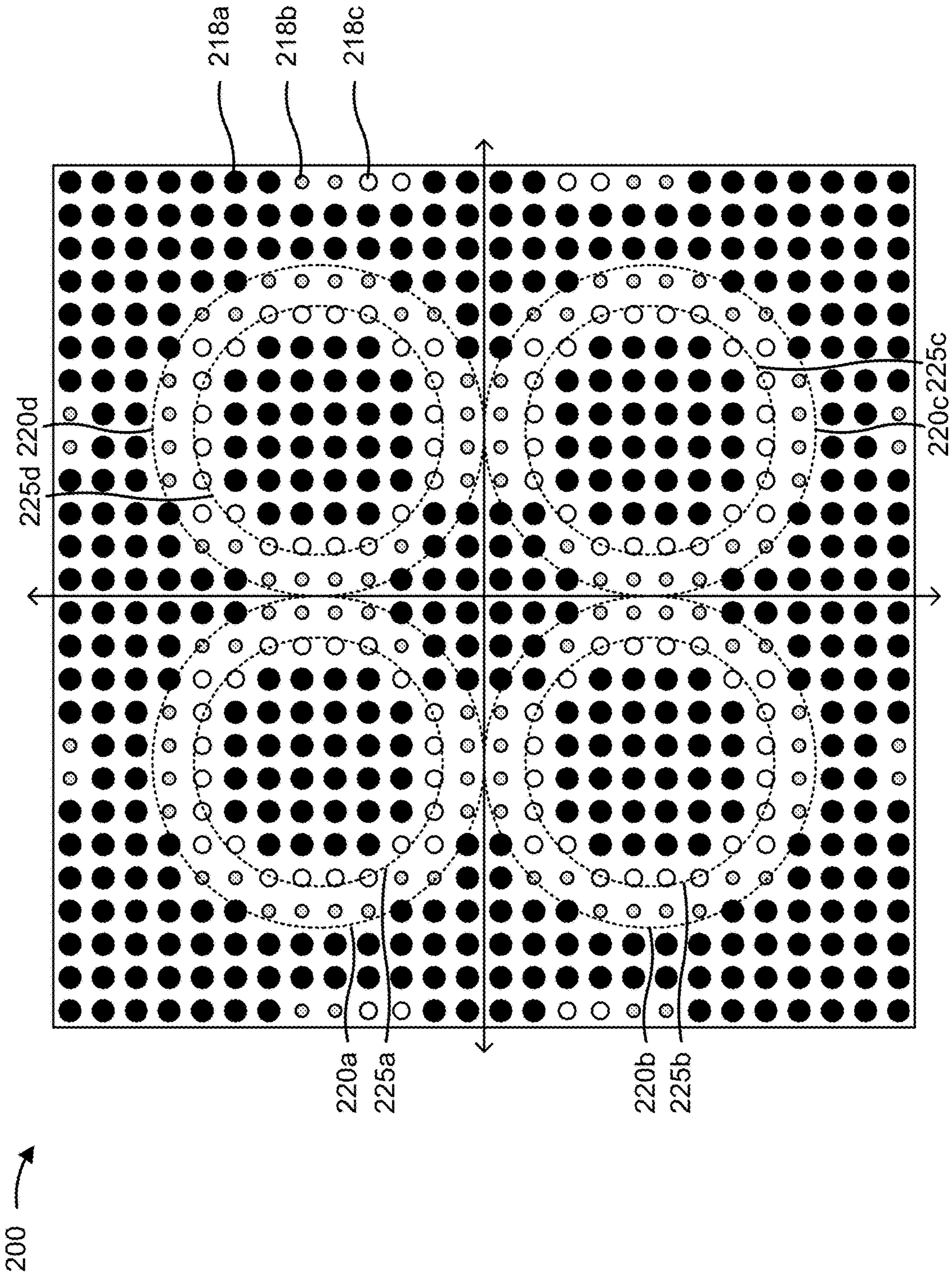
Figure 2C:
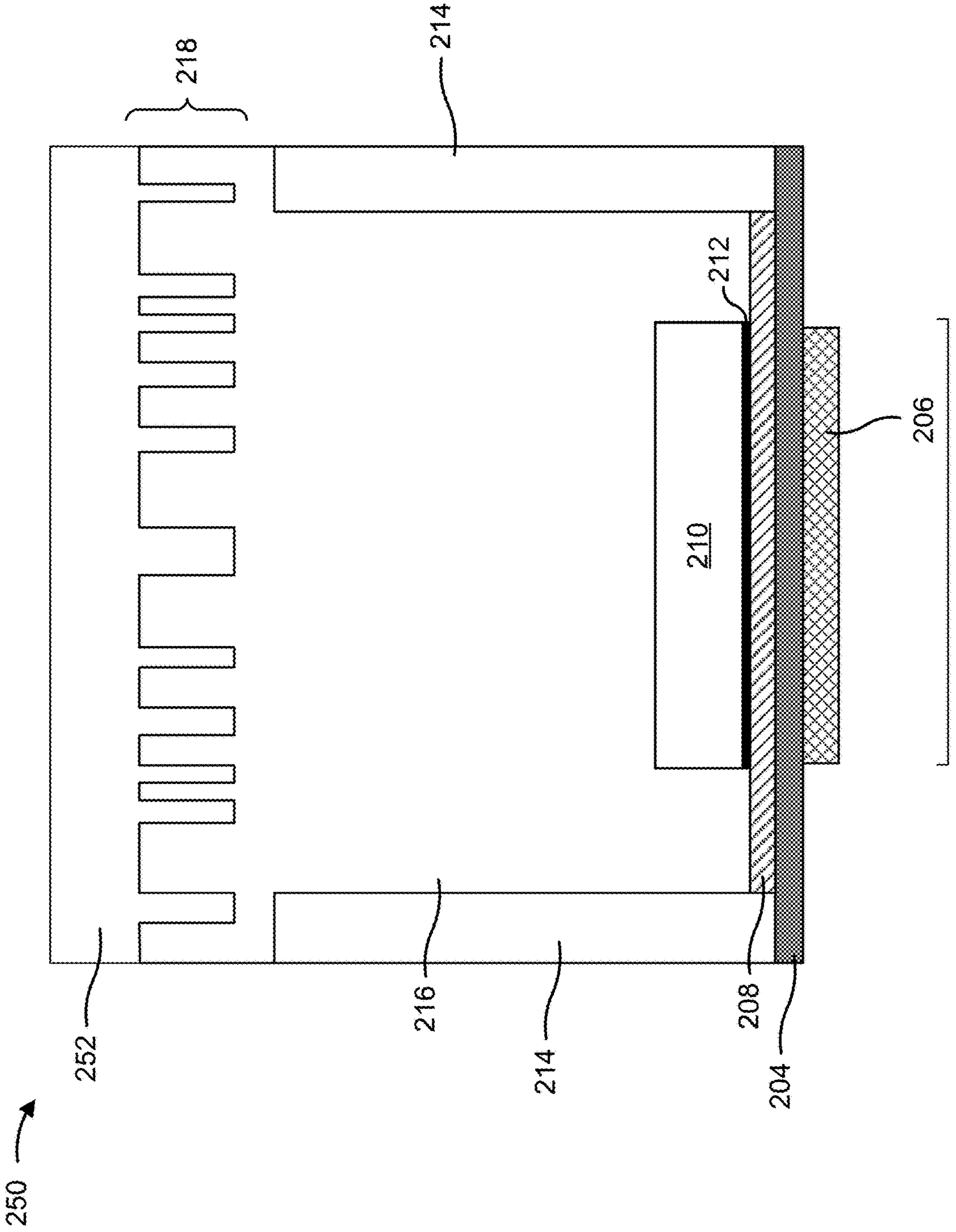

As indicated above, FIG. 2 is provided as an example. Other examples may differ from what is described with regard to FIG. 2. For example, the pixel sensors 102 may be electrically and optically isolated by an isolation structure (e.g., as described in connection with FIGS. 2A and 2C), such as a deep trench isolation (DTI) structure. The isolation structure may include a plurality of interconnected trenches that are filled with a dielectric material, such as an oxide material. The trenches of the isolation structure may be included around the perimeters of the pixel sensors 102 such that the isolation structure surrounds the pixel sensors 102. Moreover, the trenches of the isolation structure may extend into a substrate in which the pixel sensors 102 are formed to surround the photodiodes and other structures of the pixel sensors 102 in the substrate. In some implementations, the isolation structure includes a back side DTI (BDTI) structure with a high aspect ratio that is formed from the back side of the pixel array 100.

FIG. 2A is a diagram of an example pixel sensor 200 described herein. The example pixel sensor 200 includes a plurality of sub-meta lenses to result in multiple focal points for light. In some implementations, the example pixel sensor 200 illustrated in FIG. 2A may include, or may be included in, the pixel array 100 (or a portion thereof). In some implementations, the example pixel sensor 200 may be included in an image sensor. The image sensor may be a CMOS image sensor, a BSI CMOS image sensor, or another type of image sensor.

As shown in FIG. 2A, the pixel sensor 200 may include a pixel 202. The pixel 202 is supported by a substrate 204, which may include a semiconductor die substrate, a semiconductor wafer, or another type of substrate in which semiconductor pixels may be formed. In some implementations, the substrate 204 is formed of silicon (Si), a material including silicon, a III-V compound semiconductor material such as gallium arsenide (GaAs), or a silicon on insulator (SOI), among other examples.

The pixel 202 may include a transfer gate 206 to control transfer of photocurrent between a light sensor 210 and a drain region (not shown). The transfer gate 206 may be energized (e.g., by applying a voltage or a current to the transfer gate 206) to cause a conductive channel to form between the light sensor 210 and the drain region (and/or a drain extension region). The conductive channel may be removed or closed by de-energizing the transfer gate 206, which blocks and/or prevents the flow of photocurrent between the light sensor 210 and the drain region (and/or the drain extension region). Accordingly, the transfer gate 206 may facilitate electrical communication between the pixel 202 and a BEOL metallization stack (not shown) used to measure the accumulation of incident light in the pixel sensor 200 and convert the measurement to an electrical signal.

In some implementations, an etch stop layer (ESL) 208 may prevent overetching during formation of the light sensor 210 and/or an isolation structure 214. An ESL includes a material that is resistant (or at least partially resistant) to particular types of dry etching and/or wet etching. An ESL may include a material that is resistant to etchants that may otherwise be used to etch other layers near the ESL. Selecting such a material provides etch selectivity and enables the ESL to remain unetched (or mostly unetched) while other layers are etched. For example, the ESL 208 may include a nitride (such as aluminum nitride (AlN) and/or silicon nitride (SiN)) and/or an oxide (such as a silicon oxynitride ($SiO_xN_y$), aluminum oxynitride (AlON), and/or a silicon oxide ($SiO_x$)). In some implementations, the ESL 208 includes a plurality of ESLs stacked together and configured to function as a single ESL.

The light sensor 210 may function as a photodiode. A photodiode includes a region that is doped with a plurality of types of ions to form a p-n junction or a PIN junction (e.g., a junction between a p-type portion, an intrinsic (or undoped) type portion, and an n-type portion). For example, an ion implantation device tool may be used to implant an n-type dopant to form a first portion (e.g., an n-type portion) of a photodiode and a p-type dopant to form a second portion (e.g., a p-type portion) of the photodiode. The light sensor 210 may be configured to absorb photons of incident light. The absorption of photons causes the light sensor 210 to accumulate a charge (referred to as a photocurrent) due to the photoelectric effect. Here, photons bombard the light sensor 210, which causes emission of electrons of the light sensor 210. The emission of electrons causes the formation of electron-hole pairs, where the electrons migrate toward a cathode of the light sensor 210, and the holes migrate toward an anode, which produces the photocurrent. The light sensor 210 may be formed of germanium (Ge), silicon (Si), or another type of semiconductor material that is capable of generating a charge from photons of incident light.

In some implementations, the light sensor 210 is formed on a seed layer 212. The seed layer 212 may allow for growth of crystalline germanium. For example, the seed layer 212 may chemically bind to a precursor such that the light sensor 210 is formed by epitaxial growth. Although FIG. 2A depicts the seed layer 212 as a single layer, other examples may include multiple seed layers that are arranged to improve lattice matching, reduce threading dislocations, reduce tensile stress, and/or improve a quality of the light sensor 210.

The isolation structure 214 may isolate the pixel sensor 200 from adjacent pixel sensors (e.g., in a pixel array). The isolation structure 214 may provide optical isolation by blocking or preventing diffusion or bleeding of light from the pixel sensor 200 to another pixel sensor, thereby reducing crosstalk. The isolation structure 214 may include trenches or DTI structures that are coated or lined with an antireflective coating (ARC) and filled with a dielectric layer. The isolation structure 214 may be formed in a grid layout in which the isolation structure 214 extends around the perimeters of the pixel sensor 200 (and intersects at various locations of the pixel array).

A medium 216 may transit incoming light toward the light sensor 210. For example, incident photos on a top surface of the medium 216 may propagate through the medium 216 and toward the light sensor 210 (where the photons are converted to electrical signals). The medium 216 may comprise silicon (Si) or another type of material that transmits light.

The pixel sensor 200 may further include a plurality of holes 218 formed on a top surface of the medium 216. The plurality of holes 218 are not uniform or random but instead are configured to direct incoming light toward a plurality of focal points associated with a top surface of the light sensor 210. For example, the plurality of holes 218 may be arranged as described in connection with FIG. 2B. The circular patterns of the plurality of holes 218 control phases of incident light waves such that the waves are focused toward the plurality of focal points (e.g., constructively combine along paths to the focal points and destructively combine along other paths).

As further shown in FIG. 2A, each hole has a height (e.g., represented by h in FIG. 2A) that is approximately 0.5 micrometers (μm) or larger. Selecting a height of at least 0.5 μm allows for both reflection and refraction of incoming light that is initially directed away from the light sensor

210—using a smaller height would result in incoming light being reflected and/or refracted away from the light sensor 210. Additionally, each hole has a width (e.g., represented by w in FIG. 2A) that is approximately 0.5 μm or smaller. Selecting a width of no more than 0.5 μm allows for both reflection and refraction of incoming light that is initially directed away from the light sensor 210—using a larger width would allow for too much reflection off bottom surfaces of the holes 218 and away from the light sensor 210.

Because the plurality of holes 218 direct incident photons toward a plurality of focal points (e.g., as described in connection with FIGS. 3A and 3B), the plurality of holes 218 may be configured with a shorter focal length as compared with using a single focal point. As a result, a thickness or depth (e.g., represented by d in FIG. 2A) of the medium 216 is approximately 6.0 μm or smaller. Selecting a thickness of no more than 6.0 μm improves dark performance of the pixel sensor 200 by reducing optical path length and angular response of incoming light and allowing for greater miniaturization of the pixel sensor 200—using a thicker medium would result in degraded performance of the pixel sensor 200 as well as preventing uses that rely on miniaturization. As shown in FIG. 2A, the thickness is measured from a top surface of the light sensor 210 to a bottom surface of at least one of the holes 218.

FIG. 2B is a diagram of the example pixel sensor 200 described herein. FIG. 2B is similar to FIG. 2A but shows the example pixel sensor 200 from a top view rather than a cross-sectional view. As shown in FIG. 2B, the plurality of holes 218 include a first set of holes **218*a* and a second set of holes 218*b*. The set of holes 218*a* are larger than the second set of holes 218*b*. Each hole in the set of holes 218*a* has a larger surface area (on a top surface and/or on a bottom surface) than each hole in the set of holes 218*b*. For example, each hole in the set of holes 218*a* may have a larger width than each hole in the set of holes 218*b*. As a result, each hole in the set of holes 218*a* has a larger volume than each hole in the set of holes 218*b***, even when each hole has an approximately same height (e.g., a same height within a 5% or 10% margin of error).

The set of holes **218*a* are arranged over the plurality of focal points on the light sensor 210 (which is below the medium 216 and thus not shown in FIG. 2B). Additionally, the set of holes 218*b* are arranged to approximately surround the first set of holes 218*a* in a plurality of circular patterns (e.g., patterns 220*a*, 220*b*, 220*c*, and 220*d* in FIG. 2B). As used herein, a first set of holes "approximately surround" a second set of holes when a hole, in the first set of holes, is present along at least three perpendicular vectors that begin at a center associated with the second set of holes and are directed outward from the center. As used herein, "circular pattern" refers to a set of holes being approximately equidistant (e.g., within a 5% or 10% margin of error) from a center point. Based on the plurality of circular patterns, the plurality of holes 218 direct incoming light toward a plurality of focal points (e.g., as described in connection with FIGS. 3A and 3**B).

As further shown in FIG. 2B, a third set of holes **218*c* may be larger than the second set of holes 218*b* but smaller than the first set of holes 218*a*. Each hole in the set of holes 218*c* has a larger surface area (on a top surface and/or on a bottom surface) than each hole in the set of holes 218*b* but a smaller surface area (on a top surface and/or on a bottom surface) than each hole in the set of holes 218*a*. For example, each hole in the set of holes 218*c* may have a larger width than each hole in the set of holes 218*b* but a smaller width than each hole in the set of holes 218*a*. As a result, each hole in the set of holes 218*c* has a larger volume than each hole in the set of holes 218*b* and a smaller volume than each hole in the set of holes 218*a***, even when each hole has an approximately same height (e.g., a same height within a 5% or 10% margin of error).

The set of holes **218*c* are similarly arranged to approximately surround the first set of holes 218*a* in a plurality of circular patterns (e.g., patterns 225*a*, 225*b*, 225*c*, and 225*d* in FIG. 2B). Additionally, the circular patterns 225*a*, 225*b*, 225*c*, and 225*d* are approximately concentric with the circular patterns 220*a*, 220*b*, 220*c*, and 220*d*, respectively. As used herein, a first circular shape is "approximately concentric" with a second circular shape based on a center associated with the first circular shape being close to a center associated with the second circular shape (e.g., a same point or within a 5% or 10% margin of error relative to the radii of the circular shapes). Based on the concentric circular patterns, the plurality of holes 218 control phases of incoming light waves in order to focus the incoming light waves toward a plurality of focal points (e.g., as described in connection with FIGS. 3A and 3**B).

FIG. 2C is a diagram of an example pixel sensor 250 described herein. The example pixel sensor 250 includes an anti-reflective layer. In some implementations, the example pixel sensor 250 illustrated in FIG. 2C may include, or may be included in, the pixel array 100 (or a portion thereof). In some implementations, the pixel sensor 250 may be included in an image sensor. The image sensor may be a CMOS image sensor, a BSI CMOS image sensor, or another type of image sensor.

As shown in FIG. 2C, a dielectric layer 252 fills the plurality of holes 218. Additionally, as shown in FIG. 2C, the dielectric layer 252 covers a top surface of the medium 216. The dielectric layer 252 includes anti-reflective properties. For example, the dielectric layer 252 may reduce reflection off bottom surfaces of the holes 218 in order to improve performance of the light sensor 210. Additionally, the dielectric layer 252 has a different refractive index than the medium 216 in order to allow the holes 218 to direct incoming light toward the light sensor based on refraction. The dielectric layer 252 may include an oxide material and/or another type of material with anti-reflective properties.

As indicated above, FIGS. 2A-2C are provided as examples. Other examples may differ from what is described with regard to FIGS. 2A-2C. For example, although FIG. 2B is described in connection with holes of two different sizes, other examples may include additional differentiations (e.g., holes of three different sizes, holes of four different sizes, and so on). For example, a set of holes of a middle size may approximately surround the first set of holes **218*a* in circular patterns but remain inscribed within the first set of holes 218*b***.

Figure 3A:
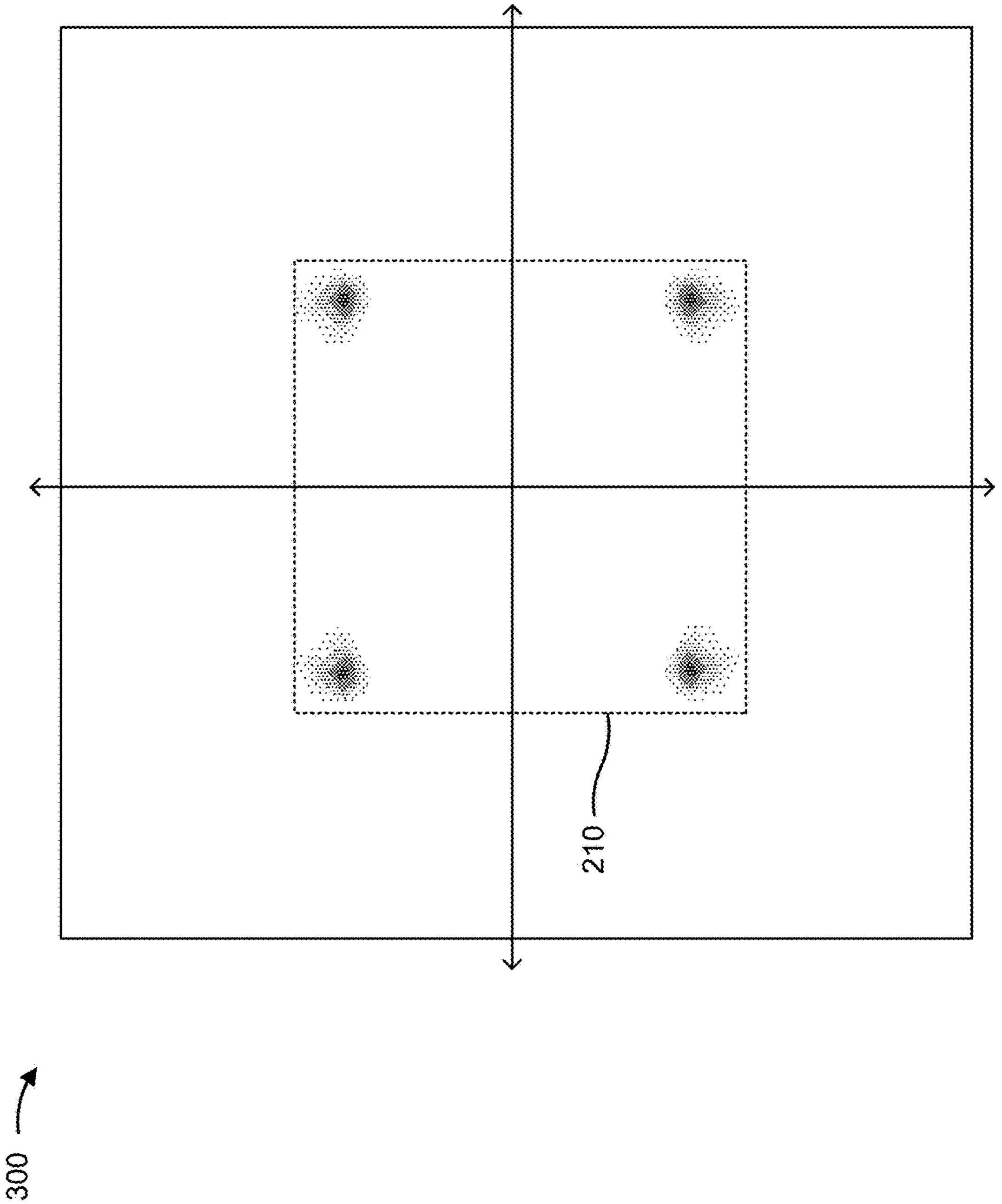
FIGS. 3A-3B are diagrams of example light and energy focus described herein.

Additionally with, or alternatively to, the pattern described in connection with FIG. 2B, the plurality of holes 218 may be arranged according to output from a machine learning model, which is trained based on historical data. For example, the machine learning model may correlate historical focal paths for incoming light (e.g., estimated based on energy measurements from the light sensor 210, an example of which is shown in FIG. 3A) with historical patterns for the plurality of holes 218. Other parameters used by the model may include historical thicknesses (and/or desired thicknesses) of the medium 216, a material used as the medium 216, a material and/or thickness used for the dielectric layer 252, a height associated with the plurality of holes 218, and/or a range of widths associated with the plurality of holes 218, among other examples. For a combination of focal points on the light sensor 210, the machine learning model may have been trained to estimate patterns of holes that result in the combination of focal points. Accordingly, the machine learning model may accept input of a desired set of focal points on the light sensor 210 and output data indicating a pattern of holes to use.

FIG. 3A is a diagram of an example energy distribution 300 for the example pixel sensor 200 described herein. As shown in FIG. 3A, energy associated with the light sensor 210 is concentrated at a plurality of points because of the plurality of sub-meta lenses, as described in connection with FIGS. 2A and 2B. An example energy distribution for a pixel sensor with a single meta lens would be concentrated at a single point on a top surface of the light sensor 210 rather than the plurality of points shown in FIG. 3A.

Figure 3B:
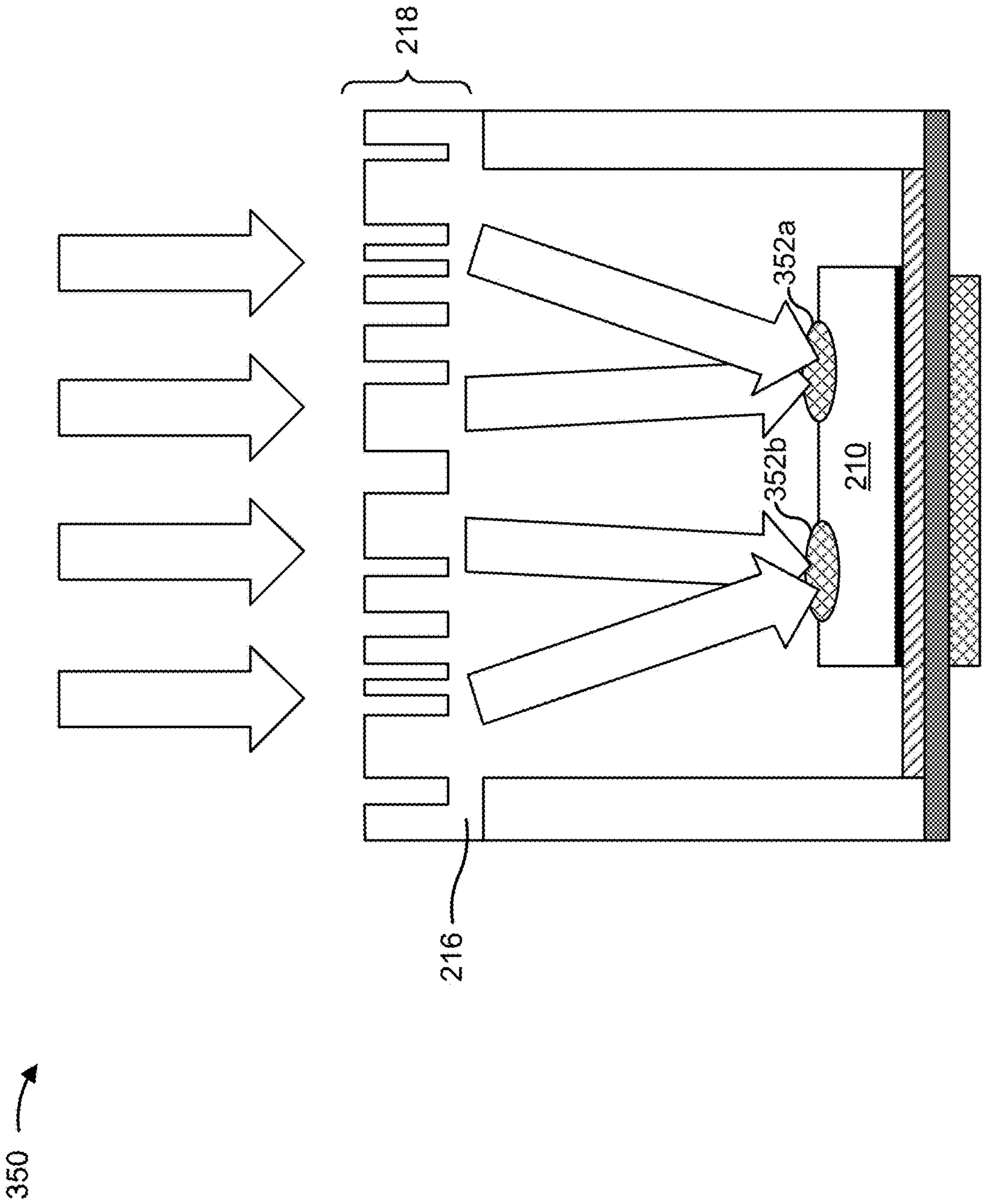

FIG. 3B is a diagram of a cross-section of an example pixel sensor 350 described herein. In some implementations, the example pixel sensor 350 illustrated in FIG. 3B may include, or may be included in, the pixel array 100 (or a portion thereof). In some implementations, the example pixel sensor 350 may be included in an image sensor. The image sensor may be a CMOS image sensor, a BSI CMOS image sensor, or another type of image sensor.

The example pixel sensor 350 of FIG. 3B is similar to the example pixel sensor 200 of FIGS. 2A and 2B. As shown in FIG. 3B, the plurality of holes 218 formed on a top surface of the medium 216 focuses incoming light toward a plurality of focal points 352. Because FIG. 3B shows a cross-section, two focal points 352*a* and 352*b* are shown. However, additional focal points may be used, such as the four focal points detectable in the example energy distribution 300 of FIG. 3A. The plurality of focal points 352 are associated with a shorter focal length as compared with using a single focal point (e.g., caused by using a single meta lens rather than a plurality of sub-meta lenses). As a result, a thickness of the medium 216 may be reduced as compared with a pixel sensor using a single meta lens, which in turn reduces an angular response of incident photons as compared with an angular response caused by a single meta lens.

As indicated above, FIGS. 3A-3B are provided as examples. Other examples may differ from what is described with regard to FIGS. 3A-3B. For example, additional focal points may be configured (e.g., six focal points or eight focal points, among other examples), or fewer focal points may be configured (e.g., three focal points or two focal points).

FIGS. 4A-4E are diagrams of an example implementation 400 described herein. The example implementation 400 may be an example process or method for forming the pixel sensor 250. The example implementation 400 may include a lithography technique for forming a plurality of holes that function as a plurality of sub-meta lenses.

Figure 4A:
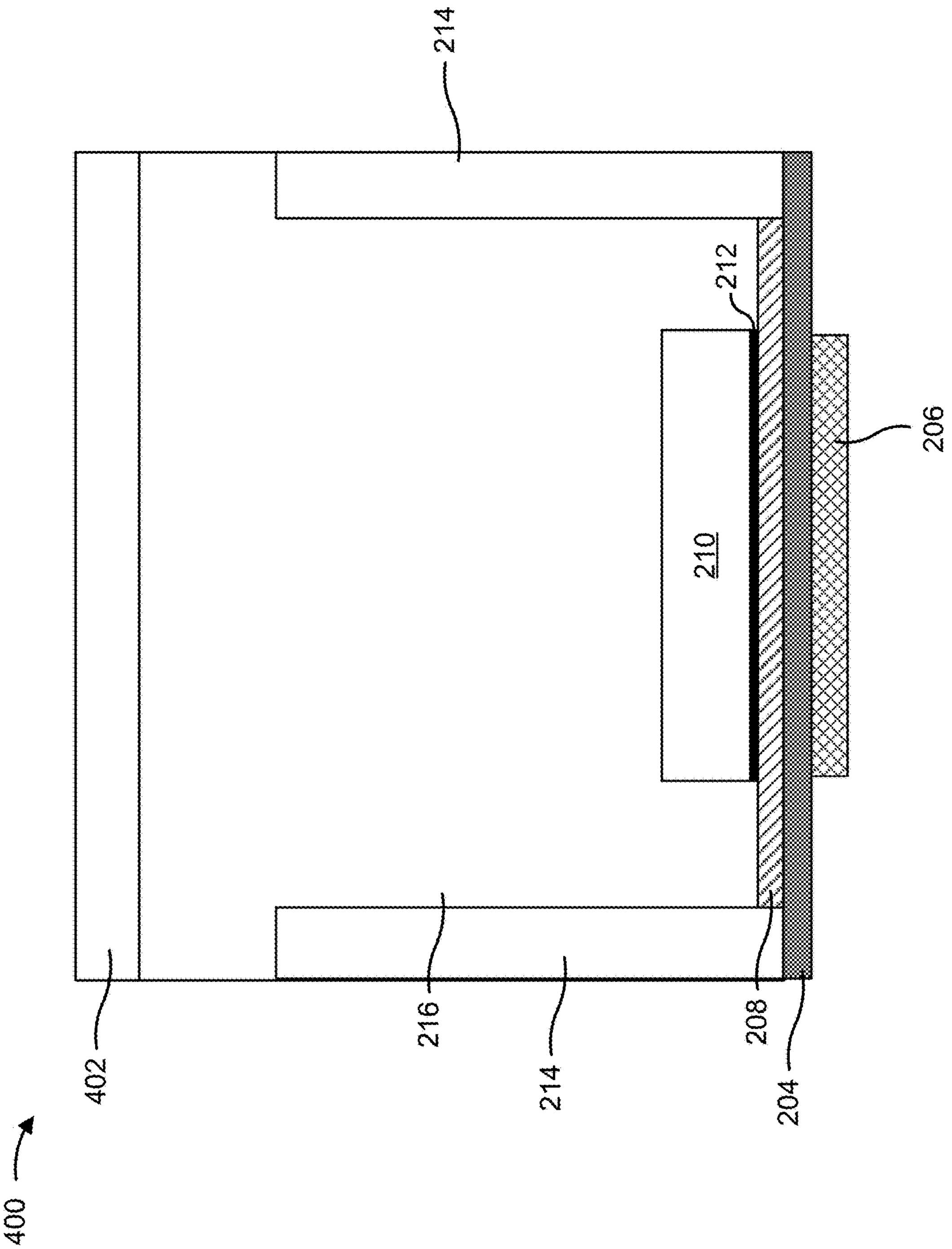
FIGS. 4A-4E are diagrams of an example implementation described herein.

As shown in FIG. 4A, the example process for forming the pixel sensor may be performed in connection with a substrate 204 supporting a transfer gate 206, an ESL 208, and a light sensor 210 formed on a seed layer 212. As further shown in FIG. 4A, a medium 216 may be formed over the light sensor 210. A deposition tool may deposit the medium 216 using a spin-coating technique, a chemical vapor deposition (CVD) technique, a physical vapor deposition (PVD) technique, an atomic layer deposition (ALD) technique, and/or another deposition technique. As described in connection with FIG. 3A, the medium 216 may be formed to a thickness of approximately 6.0 μm or smaller.

The medium 216 additionally includes an isolation structure 214 that surrounds the light sensor 210. For example, a deposition tool may form a photoresist layer over and/or on a frontside surface of the medium 216, an exposure tool may expose the photoresist layer to a radiation source to form a pattern on the photoresist layer, and a developer tool may develop and remove portions of the photoresist layer to expose the pattern. An etch tool may use a wet etch technique, a dry etch technique, a plasma-enhanced etch technique, and/or another type of etch technique to etch the medium 216, according to the pattern of the photoresist layer, in order to form trenches for the isolation structure 214. A photoresist removal tool may remove remaining portions of the photoresist layer (e.g., using a chemical stripper, a plasma asher, and/or another technique) after the medium 216 is etched, and a deposition tool may deposit dielectric material in the trenches, to form the isolation structure 214, using a spin-coating technique, a CVD technique, a PVD technique, an ALD technique, and/or another deposition technique.

As further shown in FIG. 4A, a masking layer 402 may be formed. For example, a deposition tool may form the masking layer 402 over and/or on a frontside surface of the medium 216 (e.g., using a spin-coating technique, a CVD technique, a PVD technique, an ALD technique, and/or another deposition technique).

Figure 4B:
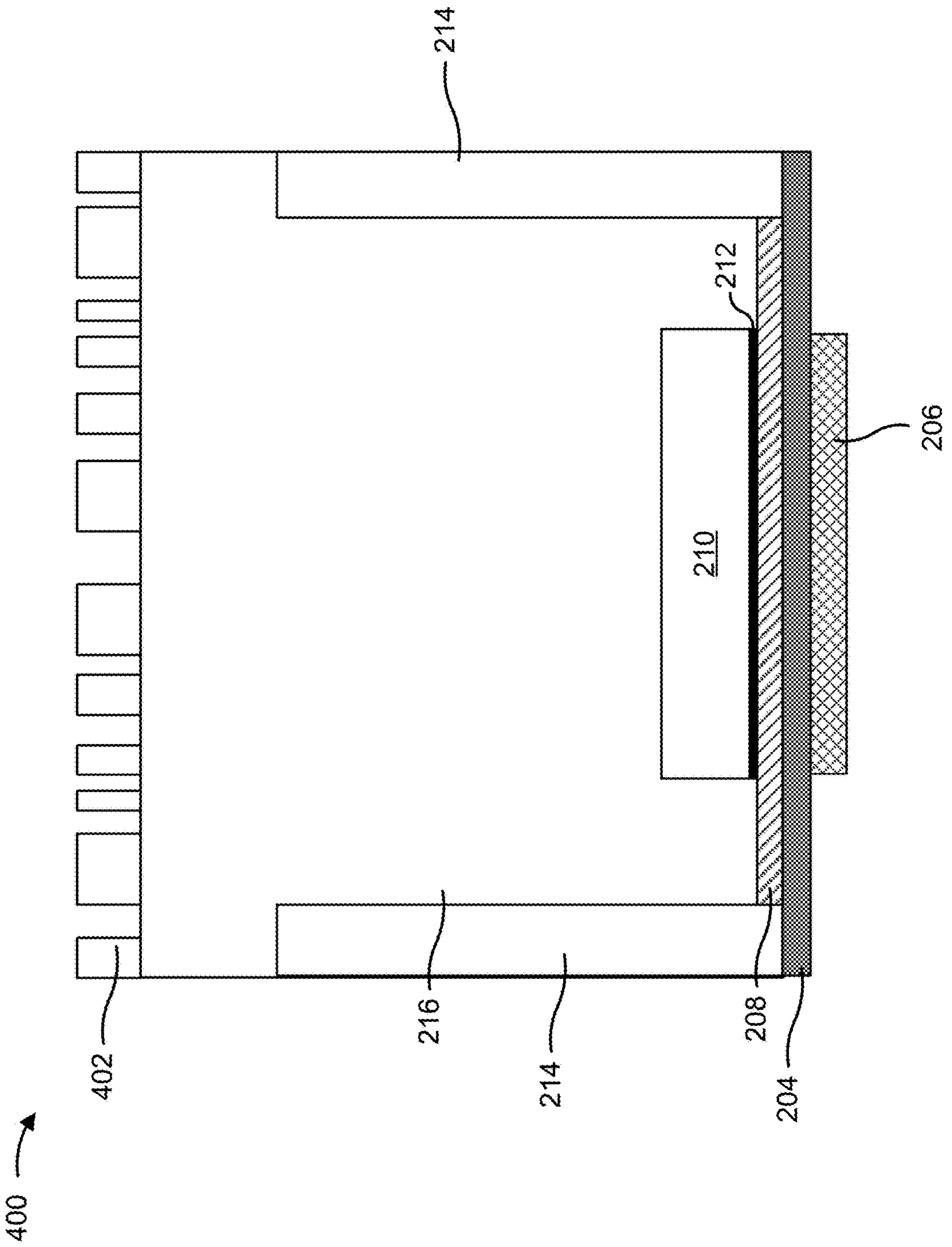

As shown in FIG. 4B, the masking layer 402 may be patterned (e.g., according to a sub-meta lens pattern, such as the pattern described in connection with FIG. 2B). For example, an exposure tool may expose the masking layer 402 to a radiation source to form a pattern on the masking layer 402, and a developer tool may develop and remove portions of the masking layer 402 to expose the pattern. As described in connection with FIGS. 3A and 3B, the pattern may be configured to direct incoming light toward a plurality of focal points associated with a top surface of the light sensor 210.

Figure 4C:
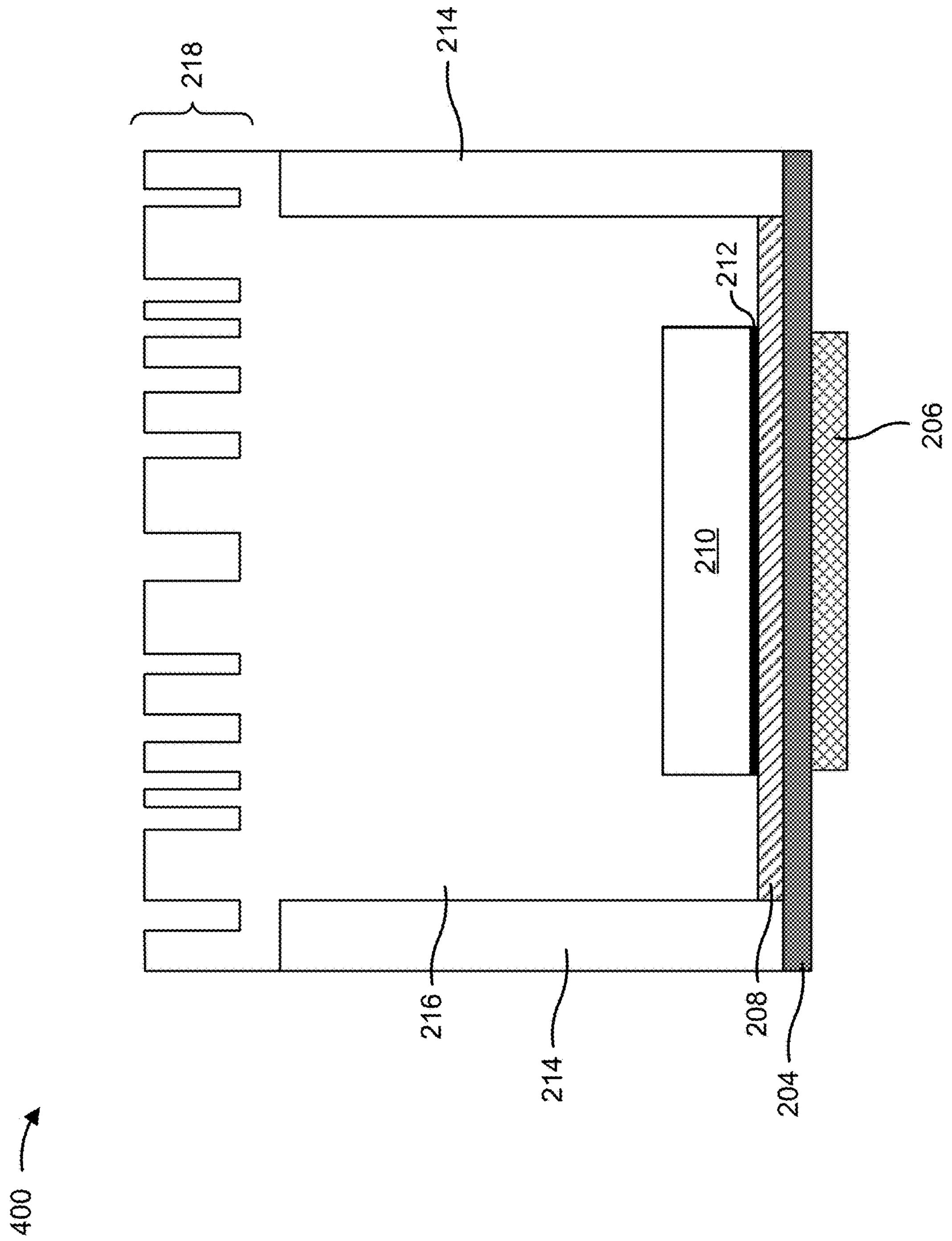

As shown in FIG. 4C, a portion of the medium 216 may be removed. For example, an etch tool may use a wet etch technique, a dry etch technique, a plasma-enhanced etch technique, and/or another type of etch technique to etch the medium 216. Exposed portions of the medium 216 may be etched according to the pattern of the masking layer 402. As a result, a plurality of holes 218 are formed on a top surface of the medium 216.

As further shown in FIG. 4C, the masking layer 402 is removed. For example, a photoresist removal tool may remove remaining portions of the masking layer 402 (e.g., using a chemical stripper, a plasma asher, and/or another technique) after the plurality of holes 218 are formed.

Figure 4D:
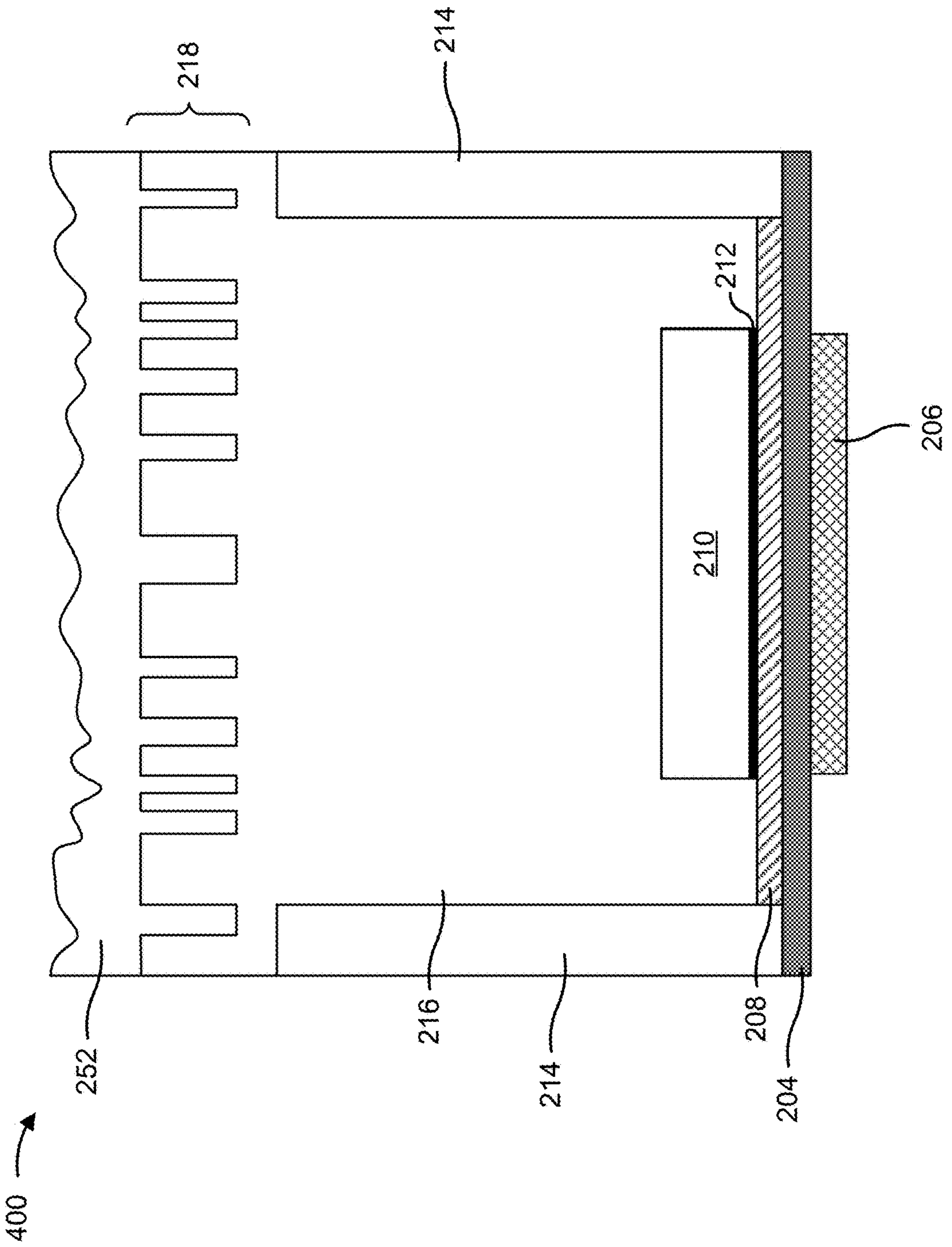

As shown in FIG. 4D, a dielectric layer 252 may be formed. For example, a deposition tool may form the dielectric layer 252 over and/or on a frontside surface of the medium 216 (e.g., using a spin-coating technique, a CVD technique, a PVD technique, an ALD technique, and/or another deposition technique). As described in connection with FIG. 3C, the dielectric layer 252 may exhibit anti-reflective properties.

Figure 4E:
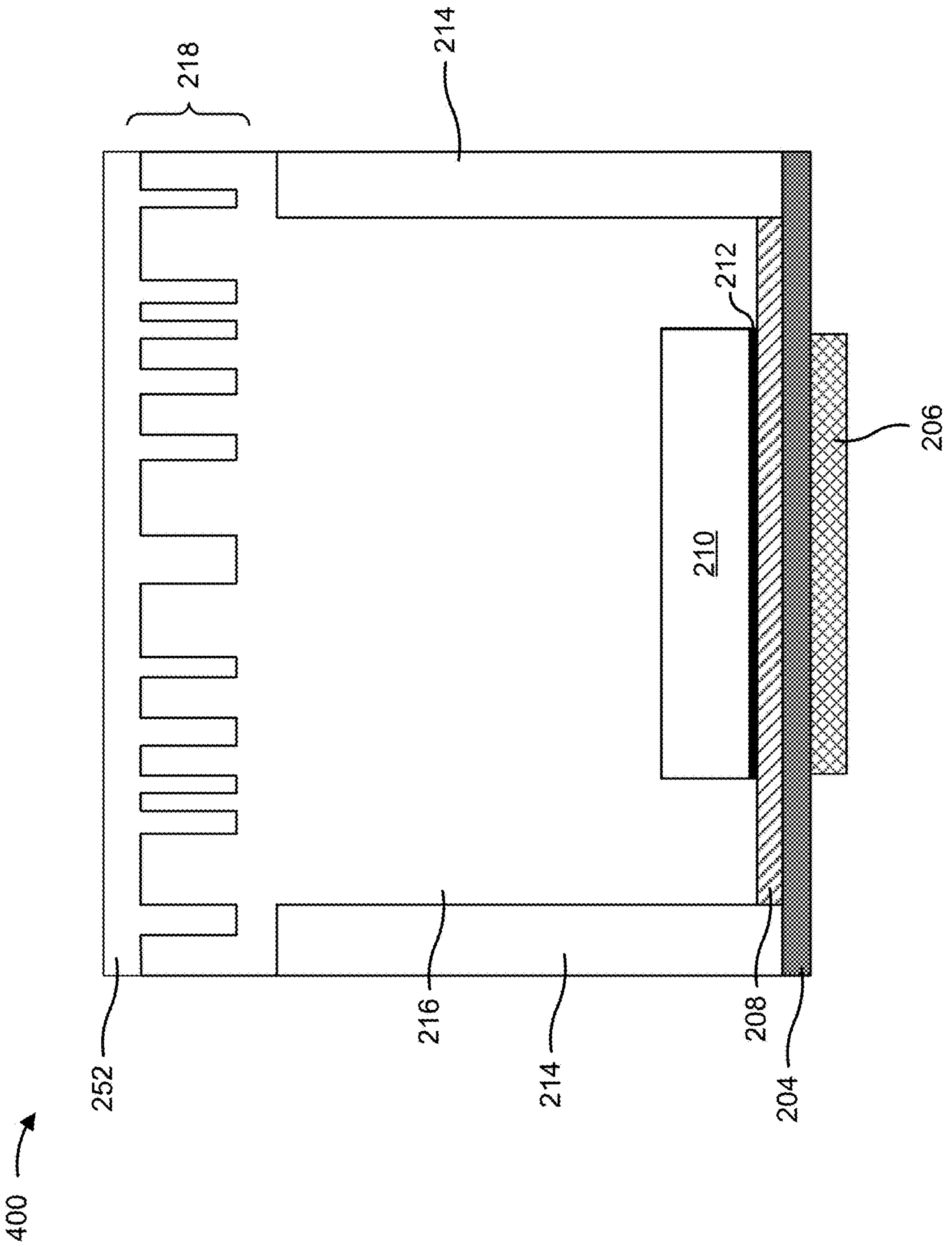

Because the dielectric layer 252 fills the plurality of holes 218 during deposition, a top surface of the dielectric layer 252 is uneven, as shown in FIG. 4D. Accordingly, as shown in FIG. 4E, the top surface of the dielectric layer 252 may be smoothed. For example, a planarization tool smooth the top surface of the dielectric layer 252 using a chemical mechanical planarization (CMP) technique.

As indicated above, FIGS. 4A-4E are provided as an example. Other examples may differ from what is described with regard to FIGS. 4A-4E. In some implementations, the dielectric layer 252 is omitted. Accordingly, the example process for forming the pixel sensor may be complete after operations described in connection with FIG. 4C rather than after operations described in connection with FIG. 4E.

Additionally, or alternatively, the masking layer 402 may include a plurality of layers configured to allow for formation of the plurality of holes 218 via lithography. For example, the plurality of layers may include a bottom layer, a middle layer, and a photoresist layer.

FIGS. 5A-5G are diagrams of an example implementation 500 described herein. The example implementation 500 may be an example process or method for forming the pixel sensor 200. The example implementation 500 may include a double patterning technique for forming a plurality of holes that function as a plurality of sub-meta lenses. Double patterning may achieve smaller widths for some of the holes while consuming additional power, processing resources, and raw materials than other lithography techniques.

Figure 5A:
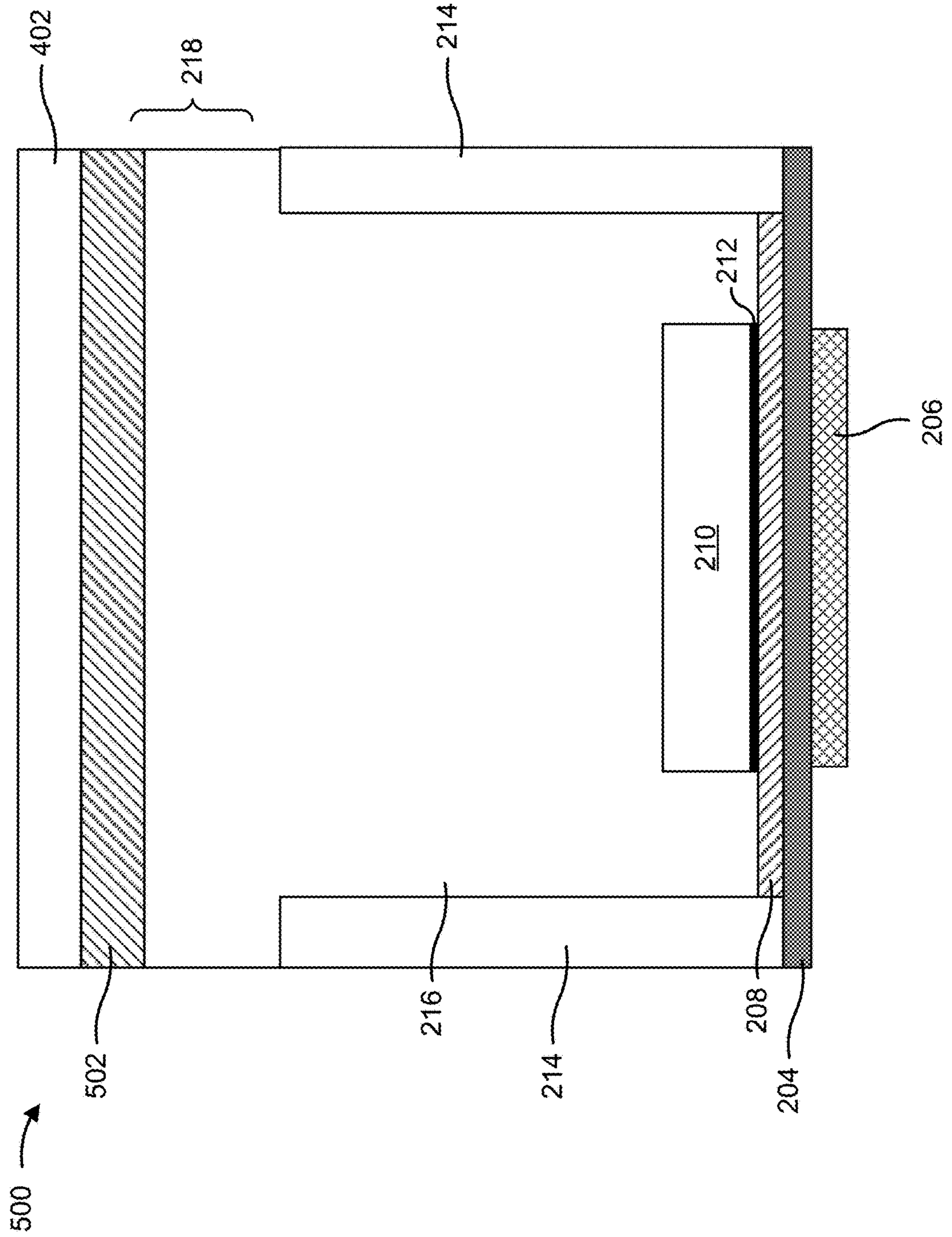
FIGS. 5A-5G are diagrams of an example implementation described herein.

As shown in FIG. 5A, the example process for forming the pixel sensor may be performed in connection with a substrate 204 supporting a transfer gate 206, an ESL 208, and a light sensor 210 formed on a seed layer 212. Additionally, as further shown in FIG. 5A, a medium 216 is formed over the light sensor 210, and the medium 216 includes an isolation structure 214 that surrounds the light sensor 210.

As shown in FIG. 5A, a first material 502 may be formed. For example, a deposition tool may form the first material 502 over and/or on a frontside surface of the medium 216 (e.g., using a spin-coating technique, a CVD technique, a PVD technique, an ALD technique, and/or another deposition technique). The first material 502 may include a metal (e.g., titanium nitride (TiN), tungsten (W), and/or aluminum (Al), among other examples) and/or another material that may be etched separately from masking layer 402 (e.g., by using a different etchant and/or a different etching technique).

As further shown in FIG. 5A, the masking layer 402 may be formed. For example, a deposition tool may form the masking layer 402 over and/or on a frontside surface of the first material 502 (e.g., using a spin-coating technique, a CVD technique, a PVD technique, an ALD technique, and/or another deposition technique). The masking layer 402 may include a high-K material and/or another material that may be etched separately from the first material 502 (e.g., by using a different etchant and/or a different etching technique).

Figure 5B:
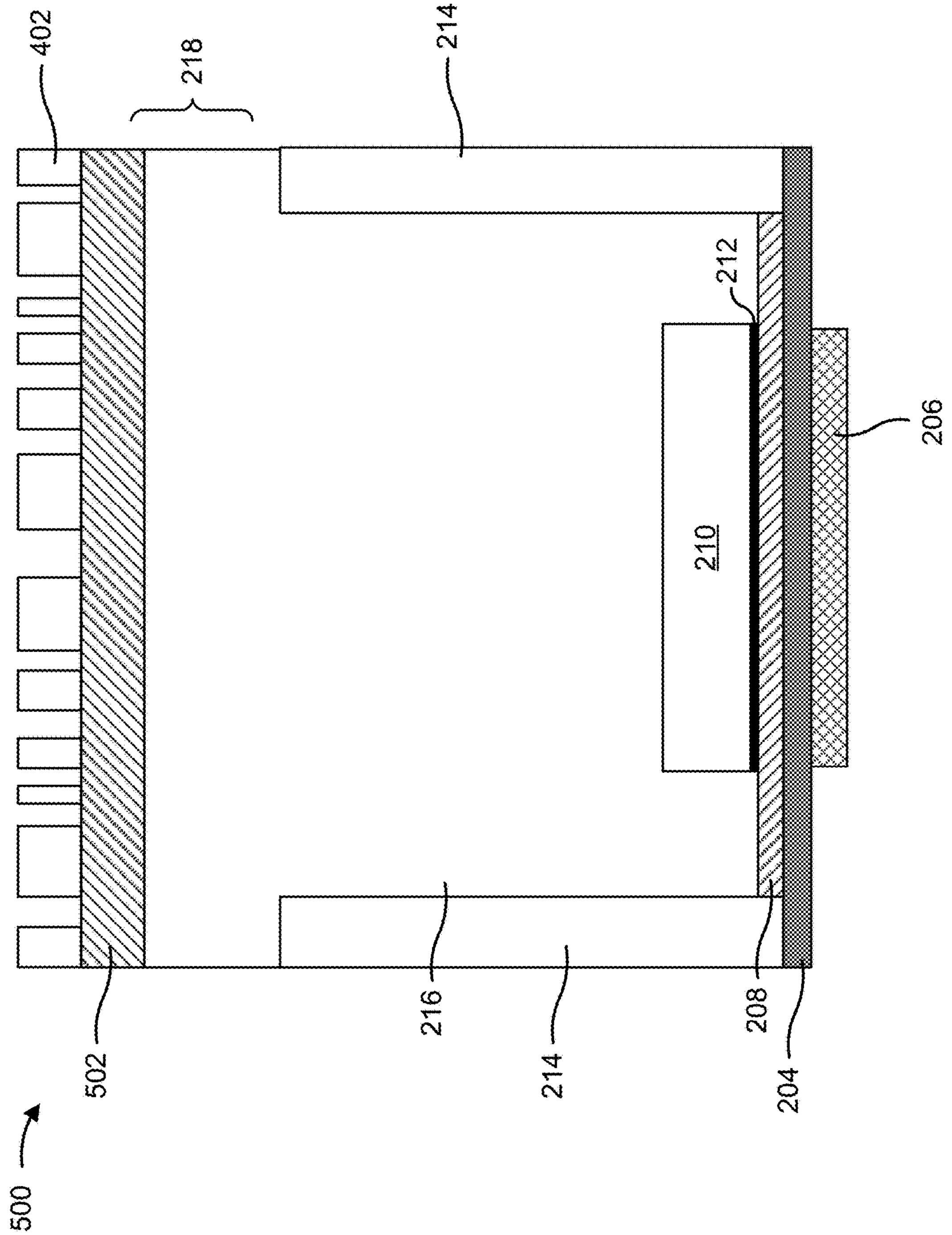

As shown in FIG. 5B, the masking layer 402 may be patterned. For example, an exposure tool may expose the masking layer 402 to a radiation source to form a pattern on the masking layer 402, and a developer tool may develop and remove portions of the masking layer 402 to expose the pattern. The pattern may be an intermediate pattern designed such that an eventual patterning of a top surface of the medium 216 is configured to direct incoming light toward a plurality of focal points associated with a top surface of the light sensor 210.

Figure 5C:
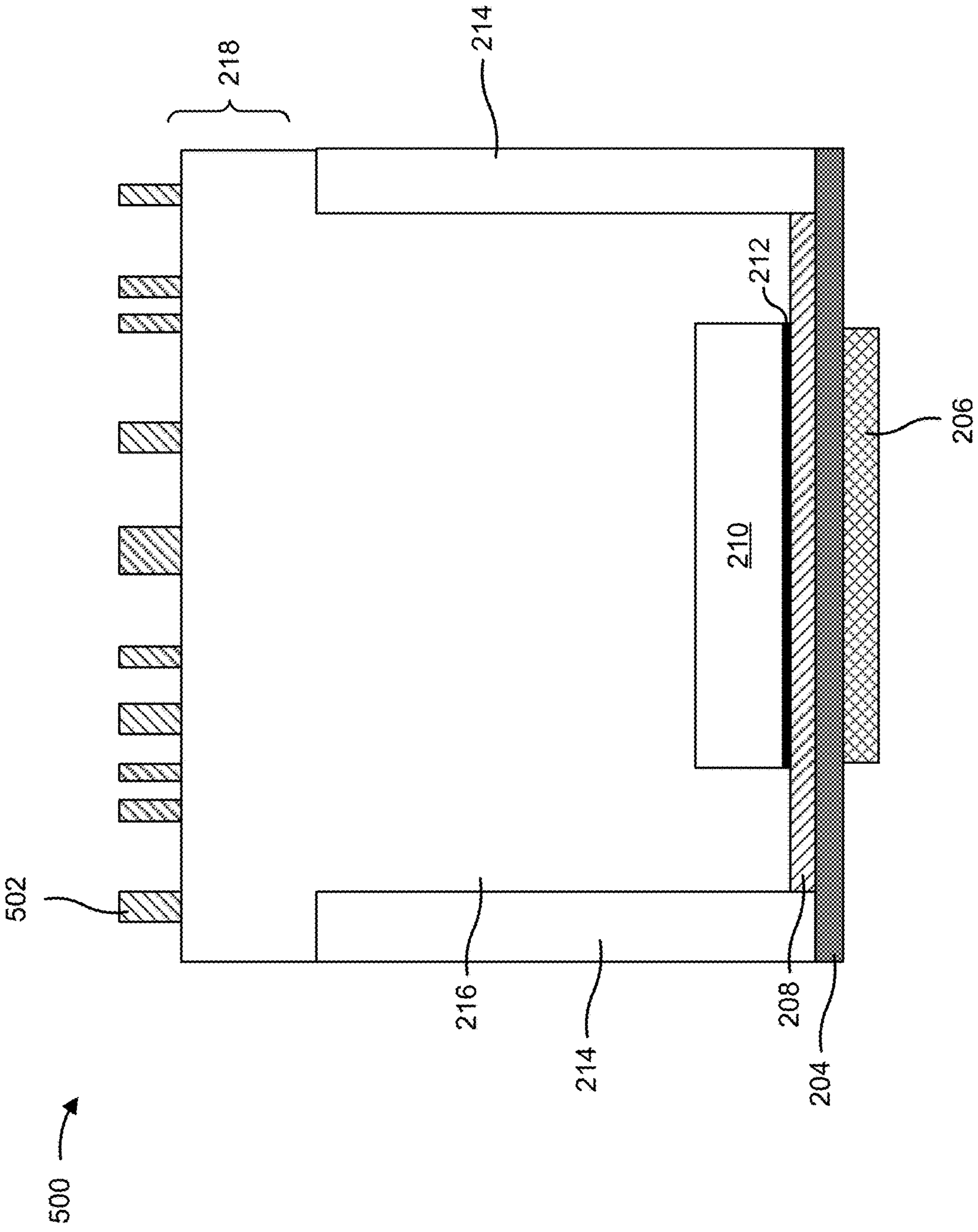

As shown in FIG. 5C, a portion of the first material 502 may be removed. For example, an etch tool may use a wet etch technique, a dry etch technique, a plasma-enhanced etch technique, and/or another type of etch technique to etch the first material 502. Exposed portions of the first material 502 may be etched according to the pattern of the masking layer 402.

As further shown in FIG. 5C, the masking layer 402 is removed. For example, a photoresist removal tool may remove remaining portions of the masking layer 402 (e.g., using a chemical stripper, a plasma asher, and/or another technique) after the first material 502 is etched.

Figure 5D:
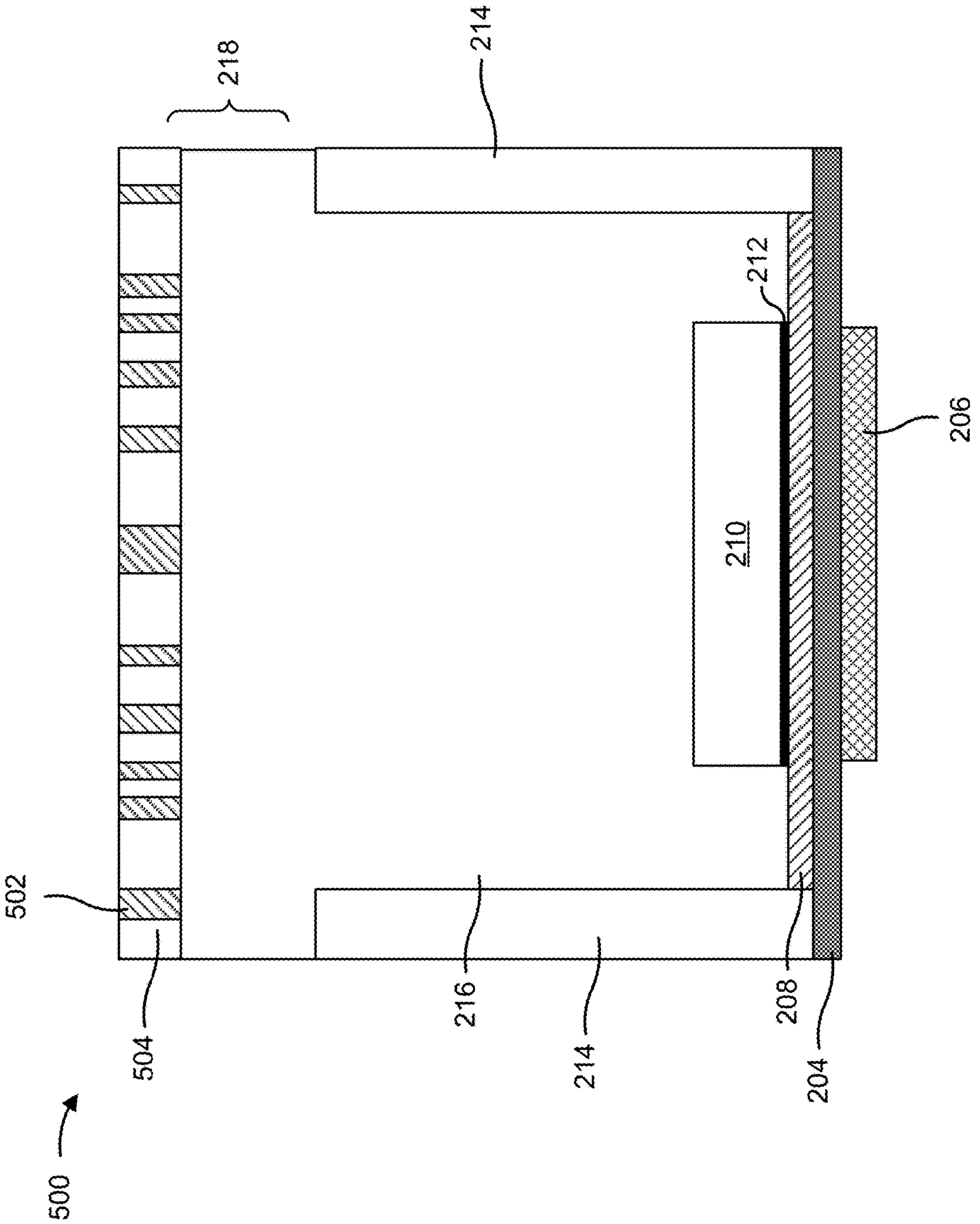

As shown in FIG. 5D, a second material 504 may be formed adjacent to the first material 502. For example, a deposition tool may form the second material 504 over and/or on the frontside surface of the medium 216 (e.g., using a spin-coating technique, a CVD technique, a PVD technique, an ALD technique, and/or another deposition technique). The second material 504 may include a metal material, an oxide material, and/or another material that may be etched separately from the first material 502 (e.g., by using a different etchant and/or a different etching technique). In some implementations, the second material 504 includes a material that can be selectively deposited on the medium 216. Therefore, as shown in FIG. 5D, the second material 504 is deposited on exposed surfaces of the medium 216 but not on top surfaces and sidewalls of the first material 502. Alternatively, the second material 504 includes a material that can be selectively deposited on the first material 502. Therefore, the second material 504 may be deposited on top surfaces and sidewalls of the first material 502 but not on exposed surfaces of the medium 216.

Figure 5E:
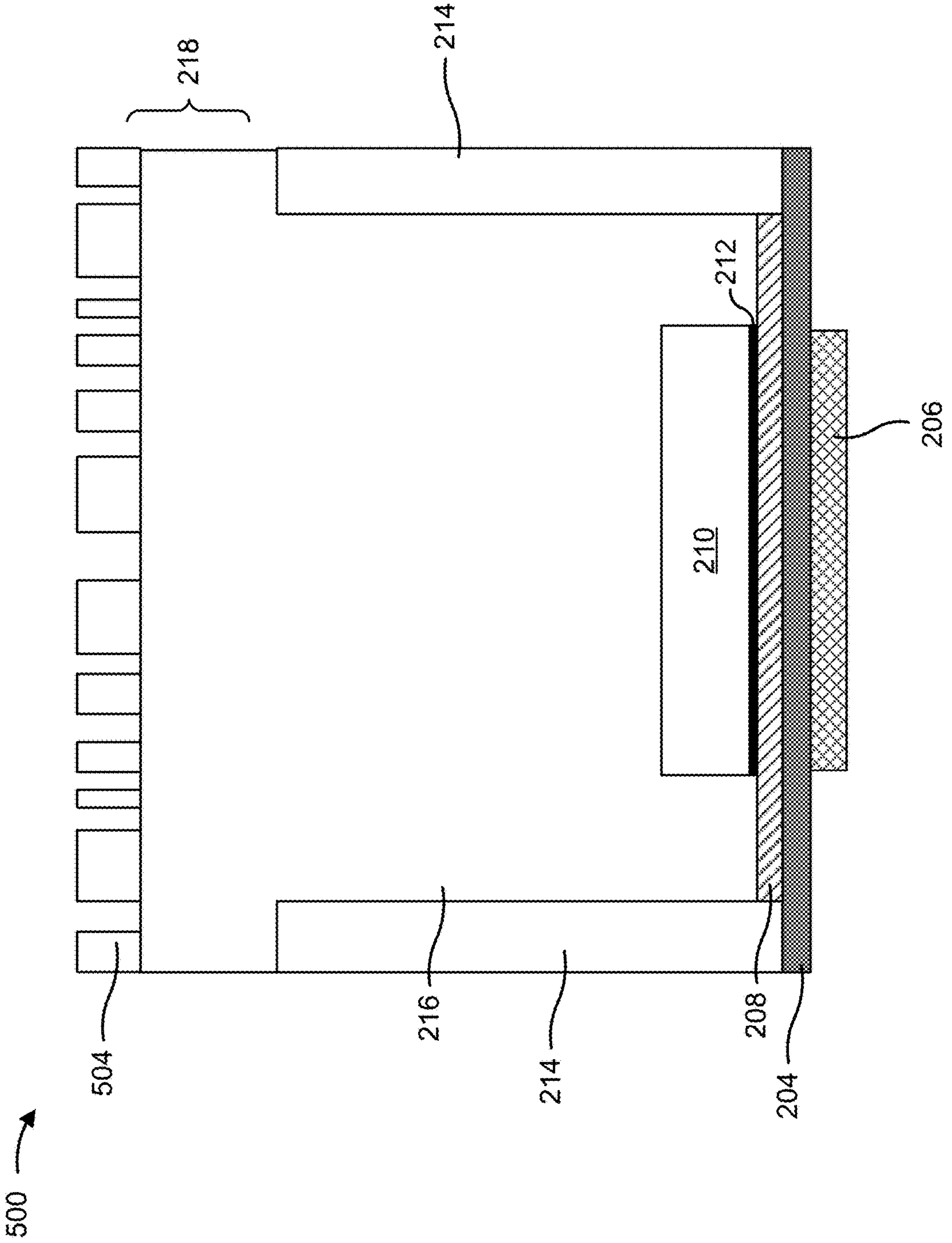

As shown in FIG. 5E, the first material 502 may be removed. For example, an etch tool may perform an isotropic etch cycle (e.g., using a dry etch or a wet etch) to remove the first material 502. For example, the second material 504 may be selected for resistivity the etchant and/or the etching technique used to remove the first material 502. As a result, the second material 504 may remain in a sub-meta lens pattern, such as the pattern described in connection with FIG. 2B.

Figure 5F:
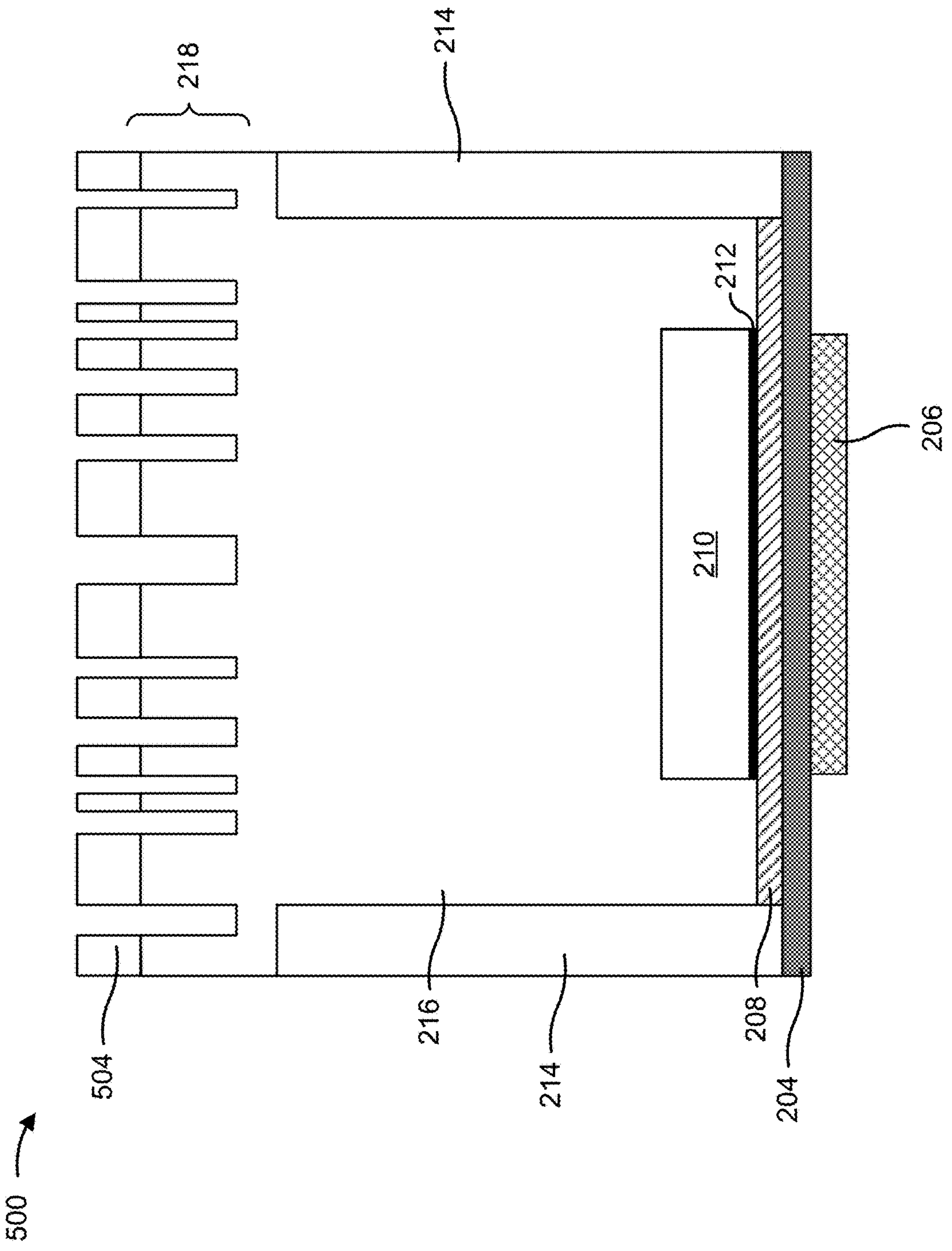

As shown in FIG. 5F, the medium 216 may be patterned (e.g., according to a sub-meta lens pattern, such as the pattern described in connection with FIG. 2B). For example, an etch tool may perform an isotropic etch cycle (e.g., using a dry etch or a wet etch) to remove a portion of the medium 216 that is not under remaining portions of the second material 504. For example, the second material 504 may be selected for resistivity the etchant and/or the etching technique used to remove the medium 216. A plurality of holes 218 are formed by etching the medium 216. As described in connection with FIGS. 3A and 3B, the plurality of holes 218 may be configured to direct incoming light toward a plurality of focal points associated with a top surface of the light sensor 210.

Figure 5G:
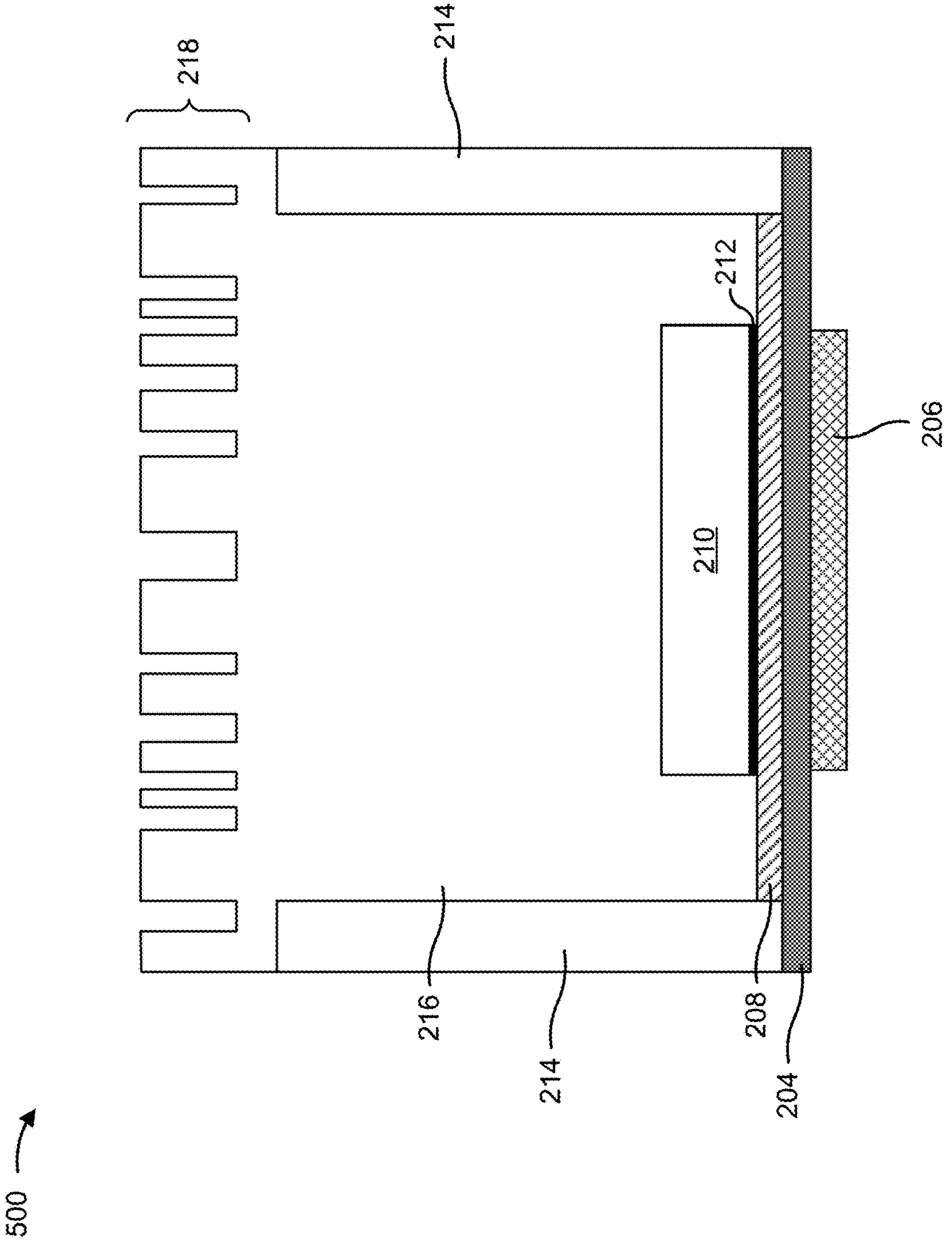

As shown in FIG. 5G, the second material 504 may be removed. For example, an etch tool may perform an isotropic etch cycle (e.g., using a dry etch or a wet etch) to remove the second material 504.

As indicated above, FIGS. 5A-5G are provided as an example. Other examples may differ from what is described with regard to FIGS. 5A-5G. For example, the dielectric layer 252 may be included in some implementations (e.g., using operations as described in connection with FIGS. 4D and 4E).

Additionally, or alternatively, the masking layer 402 may include a plurality of layers. For example, the plurality of layers may include a bottom layer, a middle layer, and a photoresist layer. Additionally, or alternatively, although the example implementation 400 is described in connection with sidewall image transfer, other multiple patterning techniques may be used, such as pitch splitting, self-aligned double patterning (SADP), or directed self-assembly (DSA), among other examples.

Figure 6:
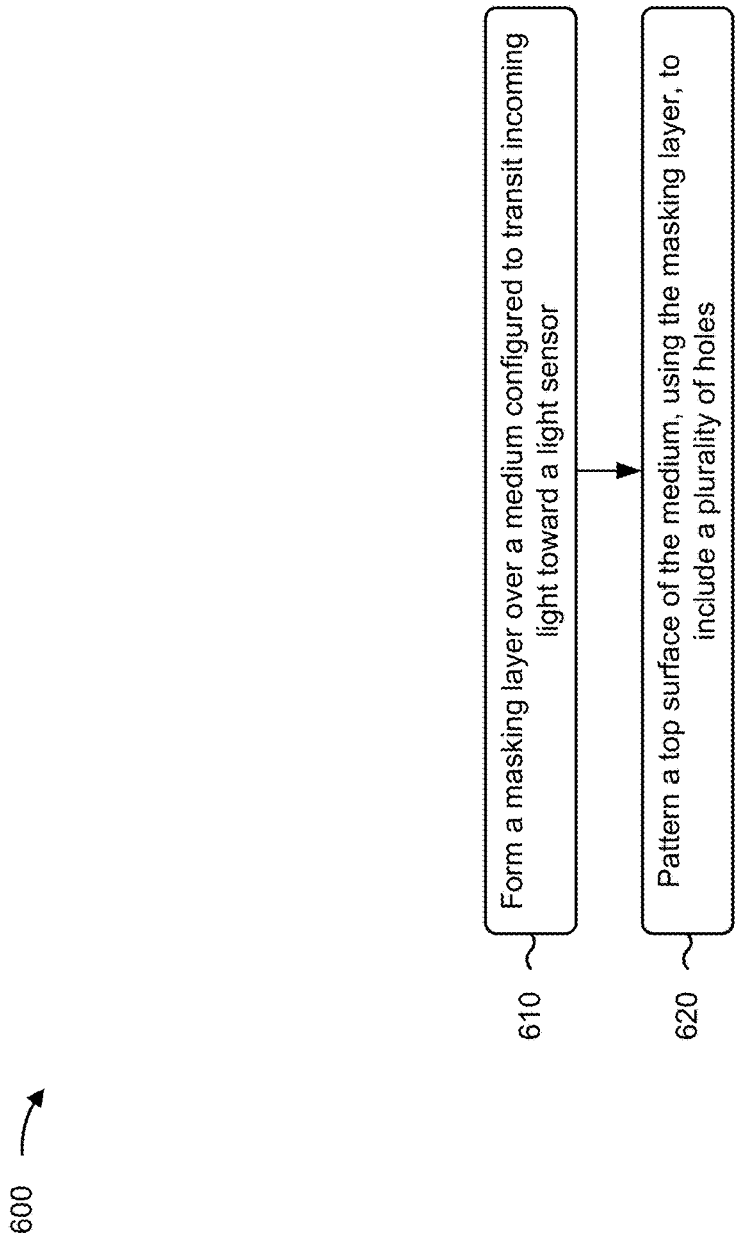
FIG. 6 is a flowchart of an example process associated with forming a semiconductor structure described herein.

FIG. 6 is a flowchart of an example process 600 associated with forming sub-meta lenses described herein. In some implementations, one or more process blocks of FIG. 6 are performed using one or more semiconductor processing tools referenced in connection with FIGS. 4A-4E and FIGS.

5A-5G. Additionally, or alternatively, one or more process blocks of FIG. 6 may be performed using another device or a group of devices separate from or including the one or more of the semiconductor processing tools, such as processing tools that may be included in a lens fabrication facility.

As shown in FIG. 6, process 600 may include forming a masking layer over a medium configured to transit incoming light toward a light sensor (block 610). For example, one or more of the semiconductor processing tools may be used to form a masking layer 402 over a medium 216 configured to transit incoming light toward a light sensor 210, as described herein.

As further shown in FIG. 6, process 600 may include patterning a top surface of the medium, using the masking layer, to include a plurality of holes (block 620). For example, one or more of the semiconductor processing tools may be used to pattern a top surface of the medium 216, using the masking layer 402, to include a plurality of holes 218, as described herein. The plurality of holes 218 are configured to direct the incoming light toward a plurality of focal points 352 associated with a top surface of the light sensor 210.

Process 600 may include additional implementations, such as any single implementation or any combination of implementations described below and/or in connection with one or more other processes described elsewhere herein.

In a first implementation, patterning the top surface of the medium 216 to include the plurality of holes 218 includes forming first set of holes 218*a*, having a first opening, that are arranged over the plurality of focal points 352 and forming a second set of holes 218*b*, having a second opening smaller than the first opening, that approximately surround the first set of holes 218*a* in a plurality of circular patterns.

In a second implementation, alone or in combination with the first implementation, process 600 includes forming the medium 216 with a thickness that is approximately 6.0 μm or smaller.

In a third implementation, alone or in combination with one or more of the first and second implementations, process 600 includes removing the masking layer 402 after patterning the top surface of the medium 216.

In a fourth implementation, alone or in combination with one or more of the first through third implementations, each hole, in the plurality of holes 218, has a height that is approximately 0.5 μm or larger and has a width that is approximately 0.5 μm or smaller.

In a fifth implementation, alone or in combination with one or more of the first through fourth implementations, process 600 includes filling the plurality of holes 218 with a dielectric layer 252. The dielectric layer 252 may further cover the top surface of the medium 216. In some examples, process 600 includes smoothing a top surface of the dielectric layer 252 using CMP.

Although FIG. 6 shows example blocks of process 600, in some implementations, process 600 includes additional blocks, fewer blocks, different blocks, or differently arranged blocks than those depicted in FIG. 6. Additionally, or alternatively, two or more of the blocks of process 600 may be performed in parallel.

In this way, a plurality of holes in a top surface of a silicon medium form a plurality of sub-meta lenses to result in multiple focal points rather than a single point (resulting from using a single meta lens). As a result, optical paths for incoming light are reduced as compared with a single optical path associated with a single meta lens, which in turn reduces angular response of incident photons. Thus, a pixel sensor including the plurality of sub-meta lenses experiences improved light focus and greater SNR. Additionally, dimensions of the pixel sensor are reduced (particularly a height of the pixel sensor), which allows for greater miniaturization of an image sensor that includes the pixel sensor.

As described in greater detail above, some implementations described herein provide a semiconductor device. The semiconductor device includes a light sensor configured to convert incoming light to electrical signals. The semiconductor device includes a medium configured to transit the incoming light toward the light sensor. The semiconductor device includes a plurality of holes on a top surface of the medium, opposite the light sensor, configured to direct the incoming light toward a plurality of focal points associated with a top surface of the light sensor.

As described in greater detail above, some implementations described herein provide a method. The method includes forming a masking layer over a medium configured to transit incoming light toward a light sensor. The method includes patterning a top surface of the medium, using the masking layer, to include a plurality of holes, where the plurality of holes are configured to direct the incoming light toward a plurality of focal points associated with a top surface of the light sensor.

As described in greater detail above, some implementations described herein provide a semiconductor device. The semiconductor device includes a light sensor configured to convert incoming light to electrical signals. The semiconductor device includes a medium configured to transit the incoming light toward the light sensor. The semiconductor device includes a set of holes on a top surface of the medium, opposite the light sensor. The set of holes includes a first subset of holes, having a first opening, that are arranged over a plurality of focal points associated with a top surface of the light sensor. The set of holes includes a second subset of holes, having a second opening smaller than the first opening, that approximately surround the first subset of holes in a plurality of circular patterns.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:

a light sensor configured to convert incoming light to electrical signals;

a medium formed over and around the light sensor,
  wherein the medium is configured to transit the incoming light toward the light sensor; and a plurality of holes formed partially through the medium,
  wherein the plurality of holes are on a first side of the medium opposite to a second side of the medium where the light sensor is formed, wherein portions of the medium are formed around side surfaces and under bottom surfaces of the plurality of holes, wherein a material different from the medium fills the plurality of holes, and wherein the plurality of holes are configured to direct the incoming light toward a plurality of focal points associated with a top surface of the light sensor.

2. The semiconductor device of claim 1, wherein the light sensor comprises a germanium light sensor.

3. The semiconductor device of claim 1, wherein each hole, in the plurality of holes, has a width that is approximately 0.5 micrometers (μm) or smaller.

4. The semiconductor device of claim 1, wherein the medium comprises a silicon substrate.

5. The semiconductor device of claim 1, wherein the material that fills the plurality of holes is a dielectric material.

6. The semiconductor device of claim 1, further comprising:

an isolation structure formed in the medium and surrounding the light sensor.

7. The semiconductor device of claim 6, wherein a subset of the plurality of holes overlaps the isolation structure.

8. A semiconductor device, comprising:

a light sensor configured to convert incoming light to electrical signals;

a medium formed over and around the light sensor, wherein the medium is configured to transit the incoming light toward the light sensor; and a set of holes formed partially through the medium, wherein the set of holes are on a first side of the medium opposite to a second side of the medium where the light sensor is formed, wherein portions of the medium are formed around side surfaces and under bottom surfaces of the set of holes, wherein a material different from the medium fills the set of holes, and wherein the set of holes comprises:

a first subset of holes, having a first opening, that are arranged over a plurality of focal points associated with a top surface of the light sensor; and a second subset of holes, having a second opening smaller than the first opening, that approximately surround the first subset of holes in a plurality of circular patterns.

9. The semiconductor device of claim 8, wherein a thickness of the medium is approximately 6.0 micrometers (μm) or smaller.

10. The semiconductor device of claim 8, wherein each hole, in the set of holes, has a height that is approximately 0.5 micrometers (μm) or larger.

11. The semiconductor device of claim 8, wherein the material that fills the set of holes comprises a dielectric material.

12. The semiconductor device of claim 8, further comprising:

an isolation structure formed in the medium and surrounding the light sensor.

13. A semiconductor device, comprising:

a light sensor;

a semiconductor layer disposed over the light sensor;

a first plurality of holes formed partially through the semiconductor layer, wherein the first plurality of holes have a first width; and a second plurality of holes formed partially through the semiconductor layer, wherein the second plurality of holes have a second width smaller than the first width, wherein the second plurality of holes approximately surround the first plurality of holes, wherein portions of the semiconductor layer are formed around side surfaces and under bottom surfaces of the first plurality of holes and the second plurality of holes, and wherein a material different from the semiconductor layer fills the first plurality of holes and the second plurality of holes.

14. The semiconductor device of claim 13, wherein the second plurality of holes approximately surround the first plurality of holes in a plurality of circular patterns.

15. The semiconductor device of claim 13, further comprising a third plurality of holes formed in the semiconductor layer, wherein the third plurality of holes have a third width smaller than the first width, and larger than the second width.

16. The semiconductor device of claim 15, wherein the third plurality of holes approximately surround the first plurality of holes.

17. The semiconductor device of claim 15, wherein the second plurality of holes approximately surround the first plurality of holes in a first circular pattern, wherein the third plurality of holes approximately surround the first plurality of holes in a second circular pattern.

18. The semiconductor device of claim 17, wherein the second circular pattern is approximately concentric with the first circular pattern.

19. The semiconductor device of claim 17, wherein the second circular pattern is inside the first circular pattern.

20. The semiconductor device of claim 13, wherein the material that fills the first plurality of holes and the second plurality of holes comprises a dielectric material having a different refractive index than the semiconductor layer.

* * * * *